United States Patent
Iwaya et al.

(10) Patent No.: US 9,029,174 B2
(45) Date of Patent: May 12, 2015

(54) METHOD FOR MANUFACTURING SEMICONDUCTOR DEVICE

(75) Inventors: Motoaki Iwaya, Aichi (JP); Hiroshi Amano, Aichi (JP); Isamu Akasaki, Aichi (JP)

(73) Assignees: Meijo University, Aichi (JP); Soko Kagaku Co., Ltd., Aichi (JP)

( * ) Notice: Subject to any disclaimer, the term of this patent is extended or adjusted under 35 U.S.C. 154(b) by 81 days.

(21) Appl. No.: 14/001,454

(22) PCT Filed: Feb. 25, 2011

(86) PCT No.: PCT/JP2011/054343
§ 371 (c)(1),
(2), (4) Date: Aug. 23, 2013

(87) PCT Pub. No.: WO2012/114513
PCT Pub. Date: Aug. 30, 2012

(65) Prior Publication Data
US 2013/0330913 A1    Dec. 12, 2013

(51) Int. Cl.
*H01L 21/00* (2006.01)
*H01L 21/02* (2006.01)
*H01L 29/20* (2006.01)
*H01L 33/00* (2010.01)

(52) U.S. Cl.
CPC ...... *H01L 21/02365* (2013.01); *H01L 29/2003* (2013.01); *H01L 21/02458* (2013.01); *H01L 21/0254* (2013.01); *H01L 33/007* (2013.01); *H01L 33/0079* (2013.01)

(58) Field of Classification Search
CPC ............ H01L 21/0254; H01L 21/02458; H01L 21/0262; H01L 21/0242; H01L 29/2003
USPC ............ 438/21, 22, 478, 670; 257/103
See application file for complete search history.

(56) References Cited

U.S. PATENT DOCUMENTS

| | | | |
|---|---|---|---|
| 2002/0070125 A1* | 6/2002 | Ng et al. | 205/640 |
| 2003/0104678 A1 | 6/2003 | Kelly et al. | |
| 2004/0245543 A1* | 12/2004 | Yoo | 257/103 |

(Continued)

FOREIGN PATENT DOCUMENTS

JP    2010147164 A    7/2010

OTHER PUBLICATIONS

Takeuchi, M. et al., "AlN/AlGaN short-period superlattice sacrificial layers in laser lift-off for vertical-type AlGaN-based deep ultraviolet light emitting diodes", Applied Physics Letters 94, 061117, 2009, 3 pg.

*Primary Examiner* — Zandra Smith
*Assistant Examiner* — John M Parker
(74) *Attorney, Agent, or Firm* — Haynes Beffel & Wolfeld LLP

(57) ABSTRACT

A structure includes a substrate, a template layer formed on the surface of the substrate and including an AlN layer, and a device structure portion formed by stacking AlGaN semiconductor layers on the template layer. For the structure, the AlN layer is irradiated from a side close to the substrate with a laser light with a wavelength by which the laser light passes through the substrate and the laser light is absorbed by the AlN layer, in a state in which the AlN layer receives compressive stress from the substrate. This allows the AlN layer to expand more than the surface of the substrate on at least an interface between the AlN layer and the substrate so as to increase the compressive stress, in order to remove the substrate from the AlN layer.

14 Claims, 28 Drawing Sheets

(56) References Cited

U.S. PATENT DOCUMENTS

| | | |
|---|---|---|
| 2005/0066885 A1* | 3/2005 | Kamiyama et al. ............ 117/84 |
| 2005/0242365 A1* | 11/2005 | Yoo .............................. 257/103 |
| 2006/0073621 A1* | 4/2006 | Kneissel et al. ................ 438/21 |
| 2006/0154390 A1* | 7/2006 | Tran et al. ...................... 438/22 |
| 2008/0164571 A1 | 7/2008 | Kelly et al. |
| 2010/0219437 A1 | 9/2010 | Usuda et al. |
| 2012/0258286 A1* | 10/2012 | Amano et al. ................ 428/162 |

* cited by examiner

Before Cavity Expanding Process

After Cavity Expanding Process

Before Cavity Expanding Process

After Cavity Expanding Process

METHOD FOR MANUFACTURING SEMICONDUCTOR DEVICE

CROSS-REFERENCE TO RELATED APPLICATIONS

This application is a National Phase filing under 35 U.S.C. 0371 of International Application No. PCT/JP2011/054343 filed on Feb. 25, 2011.

TECHNICAL FIELD

The present invention relates to a manufacturing method of a semiconductor device having a device structure portion that is formed by stacking an AlGaN semiconductor layer (a semiconductor layer mainly made of $Al_xGa_{1-x}N$, and the semiconductor layer can include the one having an element other than Al, Ga, and N (for example, homologous element such as In, and various dopants) is added thereto. An Al composition ratio X of the semiconductor layer is 0% or more and 100% or less, and the semiconductor layer can contain AlN and GaN. The same applies hereafter.).

BACKGROUND ART

Semiconductor devices having a device structure portion (e.g., a structure of a light-emitting element) formed by stacking an AlGaN semiconductor layer on a substrate made of sapphire or on a template having the substrate have conventionally been produced. The semiconductor devices described above include the one in which, after the device structure portion is formed on the substrate or on the template, the substrate is removed (lifted off) from the device structure portion or the template. By lifting off the substrate, the heat radiation performance of the device structure portion can be enhanced, the efficiency of extracting light generated on the device structure portion can be enhanced, and a vertical structure (a structure having a pair of electrodes on and under the device structure portion) can be realized.

As a method of lifting off the substrate, Patent Document 1 proposes a method of lifting off the substrate by a process in which a laser light is emitted from the side close to the substrate, and the laser light is absorbed by a predetermined layer on the substrate to chemically decompose the layer. Specifically, the Patent Document 1 describes the method described below. In this method, a GaN layer absorbs the laser light, and then, the GaN layer is heated, whereby the GaN layer is decomposed into Ga and $N_2$. Ga deposited by the decomposition is melted, whereby the substrate is lifted off.

However, as pointed out in Non-Patent Document 1, the lift-off utilizing the mechanism similar to the GaN layer proposed in the Patent Document 1 is impossible in an AlN layer and AlGaN layer. The Non-Patent Document 1 proposes a method of mechanically lifting off a sapphire substrate and an AlN layer, which is formed on the sapphire substrate, by deforming an AlN/AlGaN superlattice layer through the absorption of laser light (wavelength: 268 nm). The laser light (wavelength: 286 nm) passes through the sapphire substrate and the AlN layer, but is absorbed by a miniband of the AlN/AlGaN superlattice layer.

PRIOR ART DOCUMENT

Patent Document

Patent Document 1: Japanese Unexamined Patent Application Publication (Translation of PCT Application) No. 2001-501778

Non-Patent Document

Non-Patent Document 1: M. Takeuchi, et al., "AlN/AlGaN short-period superlattice sacrificial layers in laser lift-off for vertical-type AlGaN-based deep ultraviolet light emitting diodes". Applied Physics Letters 94, 061117, 2009

SUMMARY OF THE INVENTION

Problems to be Solved by the Invention

The method described in the Non-Patent Document 1 needs the formation of a special layer for lifting off the substrate, which entails complicated production process. Thus, this method has a problem. In view of this, a manufacturing method of a semiconductor device that can easily lift off a substrate without a need of a formation of a special layer has been demanded.

The present invention is accomplished in view of the foregoing problem, and aims to provide a manufacturing method of a semiconductor device that can easily lift off a substrate.

Means for Solving the Problem

It has been said that the substrate cannot be lifted off from the AlN layer, since the AlN layer is different from the GaN layer. However, the inventor of the present application has found as a result of an earnest study that a substrate can be lifted off from an AlN layer by utilizing stress.

In order to attain the foregoing object, a manufacturing method of a semiconductor device, according to the present invention based upon the novel finding of the inventor of the present application includes a lift-off process that includes, for a structure including a substrate, a template layer formed on the surface of the substrate and including an AlN layer, and a device structure portion formed by stacking AlGaN semiconductor layers on the template layer, irradiating the AlN layer from a side close to the substrate with a laser light with a wavelength by which the laser light passes through the substrate and the laser light is absorbed by the AlN layer, in a state in which the AlN layer receives compressive stress from the substrate, so that the AlN layer to expand more than the surface of the substrate on at least an interface between the AlN layer and the substrate so as to increase the compressive stress, in order to remove the substrate from the AlN layer.

In the manufacturing method of the semiconductor device described above, it is preferable that the substrate is made of sapphire, and the surface of the substrate is {0001} plane, the wavelength of the laser light is 200 nm or less, and the compressive stress received by the AlN layer from the substrate before the irradiation of the laser light is preferably 10 MPa or more.

The manufacturing method of the semiconductor device described above preferably includes a dividing process in which the structure that is in a form of a wafer is divided into an element unit, before the lift-off process.

The manufacturing method of the semiconductor device described above may include a dividing process in which at least the template layer and the device structure portion of the structure that is in a form of a wafer are divided into an element unit with the wafer state being kept before the lift-off process.

The manufacturing method of the semiconductor device described above preferably includes:

a fixing process for fixing the surface of the device structure portion of the structure to a surface of a predetermined support member before the lift-off process.

In the manufacturing method of the semiconductor device described above, the fixing process preferably includes:

a connection process for connecting the surface of the device structure portion of the structure and the surface of the support member in order that a gap is formed on at least a portion between them; and a filling process of filling a filler into the gap, In the manufacturing method of the semiconductor device described above, it is preferable that the AlN layer is formed by growing AlN in a lateral direction on the surface of the substrate that is formed to have irregularities.

In the manufacturing method of the semiconductor device described above, it is preferable that the template layer may include a laterally grown layer that is formed by growing AlN or AlGaN in a lateral direction on the surface of the AlN layer after the surface of the AlN layer is formed to have irregularities.

The manufacturing method, of the semiconductor device described above preferably includes:

a cavity expanding process in which solvent is injected into a cavity generated by the lateral growth during the formation of the template layer in order to expand the cavity, before the lift-off process.

In the manufacturing method of the semiconductor device described above, the lift-off process may include:

an irradiation process for removing at least a part of the substrate from the AlN layer by the irradiation of the laser light; and an etching process for removing the substrate from, the AlN layer by etching an interface of the AlN layer that is bonded to a part of the substrate not removed from the AlN layer, after the irradiation process.

In the manufacturing method of the semiconductor device described above, the surface that is exposed by the removal of the substrate in the lift-off process is preferably a rough surface.

Effect of the Invention

According to the manufacturing method of the semiconductor device described above, the substrate can be lifted off from the AlN layer by utilizing a mechanism (increase in compressive stress) that is different from a mechanism (deposition and melting of Ga) for lifting off the substrate from, a GaN layer. Since the substrate can be lifted off from the AlN layer formed on. the surface of the substrate, the formation of a special layer for the lift-off in the template layer or the device structure portion is not needed. Therefore, the substrate can easily be lifted off.

MODE FOR CARRYING OUT THE INVENTION

Figure 1:
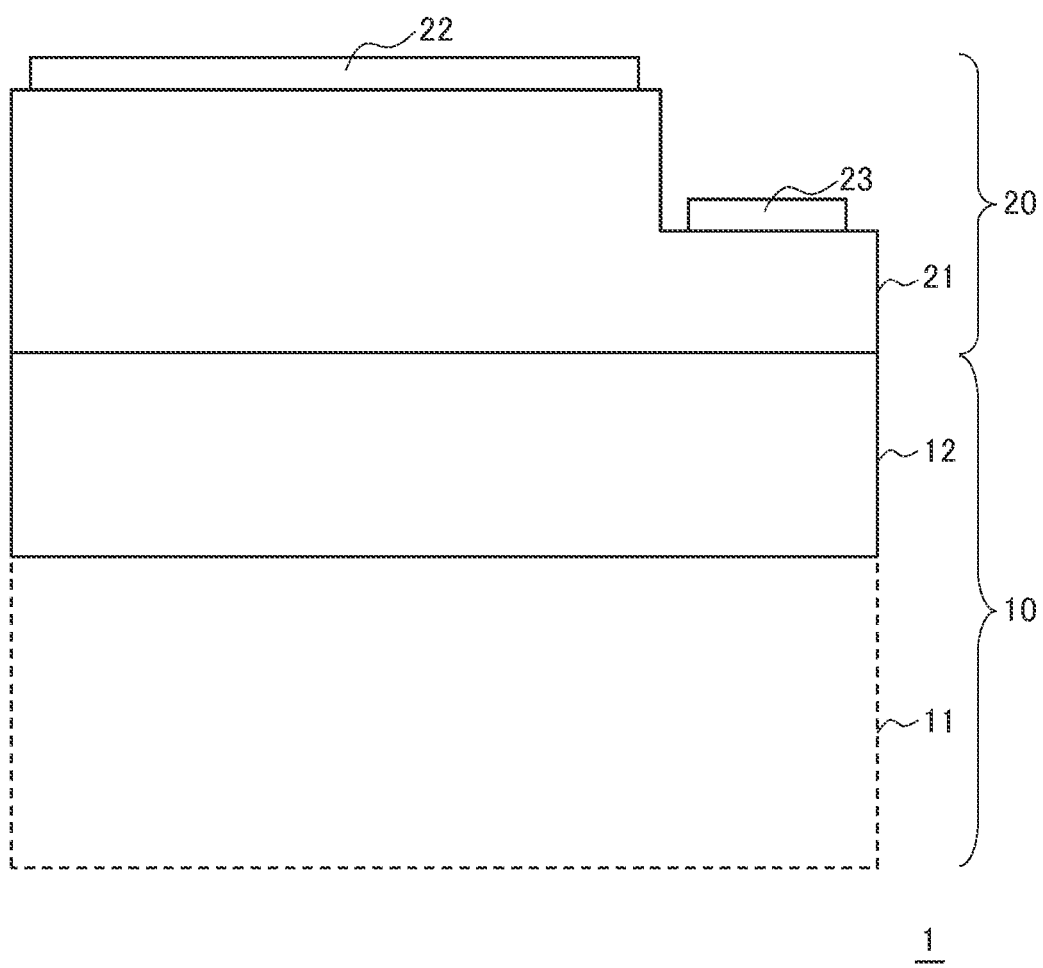
FIG. 1 is a schematic side view illustrating one example of a schematic structure of a semiconductor device.

Embodiments of a manufacturing method of a semiconductor device according to the present invention will be described below with reference to FIGS. 1 to 28. Materials and values described in the description below are only illustrative, and the manufacturing method of the semiconductor device according to the present invention can be made with various modifications. In the drawings schematically illustrated, the relative size of each component in the drawing sometimes differs from the actual size for clarifying the illustration. In the drawing illustrating an SEM photograph, tone is binarized for an International Application, so that the SEM photograph is more unclear than the actual SEM photograph.

For specifying the description, a manufacturing method of a light-emitting diode will mainly he described. However, the semiconductor device to which the present invention is applicable is not limited to the light-emitting diode, but the present invention is applicable to a light-emitting device such as a laser device or various devices other than the light-emitting device. For specifying the description, MOCVD (Metal Organic Chemical Vapor Deposition) method is applied as a method of growing a semiconductor layer. However, any known methods such, as HVPE (Hydride Vapor Phase Epitaxy) and MBE (Molecular Beam Epitaxy) methods are applicable.

<<Schematic Structure of Semiconductor Device>>

Before the description of each embodiment, of the manufacturing method of a semiconductor device according to the present invention, a schematic structure of a semiconductor device to which the manufacturing method of a semiconductor device according to the present invention can be applied will be described with reference to FIG. 1. FIG. 1 is a schematic side view illustrating one example of a schematic structure of a semiconductor device. As illustrated in FIG. 1, a semiconductor device 1 includes a template layer 12, a stacked layer portion 21 formed on the predetermined surface of the template layer 12, and electrodes 22 and 23 formed on a predetermined surface of the stacked layer portion 21.

The template layer 12 is formed on a predetermined surface of a substrate 11. Since the manufacturing method of a semiconductor device according to the present invention includes a lift-off process of the substrate 11, the substrate 11 is lifted off from the template layer 12 during the manufacture. FIG. 1 illustrates the substrate 11, which is not present in the semiconductor device 1 finally formed, with a broken line.

In the description below, a direction parallel to the surface of the substrate 11 on which the template layer 12 is formed is referred to as "lateral direction", and a direction perpendicular to the surface is referred to as "vertical direction". The direction in which the template layer 12 is present with respect to the substrate 11, and the direction in which the stacked layer portion 21 is present with respect to the template layer 12 are specified as an upward direction. In the description below, the substrate 11 and the template layer 12 are collectively referred to as a "template" 10, and the stacked layer portion 21 and the electrodes 22 and 23 are collectively referred to as a "device structure portion" 20. The template layer 12 includes at least an AlN layer formed directly on the predetermined surface (top surface) of the substrate 11. The substrate 11 is made of sapphire, and the predetermined surface (top surface) of the substrate 11 is {0001} plane, for example.

The stacked layer portion 21 is formed by stacking at least one AlGaN semiconductor layer on the template layer 12. The stacked layer portion 21 is processed, according to need. For example, in the semiconductor device in FIG. 1, a part of the stacked layer portion 21 is removed up to a predetermined layer from the top by etching. The electrode 23 is formed on the surface formed by the processing, and the electrode 22 is formed on the top surface of the stacked layer portion 21 that is not processed. When electric current flows between the electrodes 22 and 23, a predetermined layer in the stacked layer portion 21 emits light.

At least a part (a portion just below the electrode 22, in particular) of the template layer 12 may be removed by etching, and the electrode 23 may be formed to be in contact with the lower surface of the stacked, layer portion 21 that is exposed by the etching (specifically, a vertical structure may be formed). When the semiconductor device 1 is formed to have the vertical structure, current flows in the vertical direction of the stacked layer portion 21. Therefore, this semiconductor device can reduce electric resistance, compared to the semiconductor device in FIG. 1 that needs the flow of the electric current also in the lateral direction. In this case, the processing of removing a part of the stacked layer portion 21 from the top is not needed.

The structure of the semiconductor device 1 illustrated in FIG. 1 is only illustrative, and the manufacturing method of a semiconductor device according to the present invention can be applied to other semiconductor devices. However, for embodying the description, the method of manufacturing the semiconductor device 1 having the structure illustrated in FIG. 1 is described, in principle, in each embodiment of the manufacturing method of a semiconductor device described below.

<<Manufacturing Method of Semiconductor Device>>

<First Embodiment>

(Template Manufacturing Process)

A first embodiment of the manufacturing method of a semiconductor device will be described below with, reference to the drawings. Firstly, the manufacturing process of the template 10 described above will be described with reference to FIGS. 2 to 4. FIGS. 2 to 4 are schematic side views illustrating the manufacturing process of the template in first to third examples. FIGS. 2 to 4 illustrate the side face similar to the side face illustrated in FIG. 1. In FIGS. 2 to 4, A to D illustrate the order of the process.

First Example

Figure 2A:
FIG. 2 is a schematic side view illustrating a manufacturing process of a template in a first example.
Figure 2B:
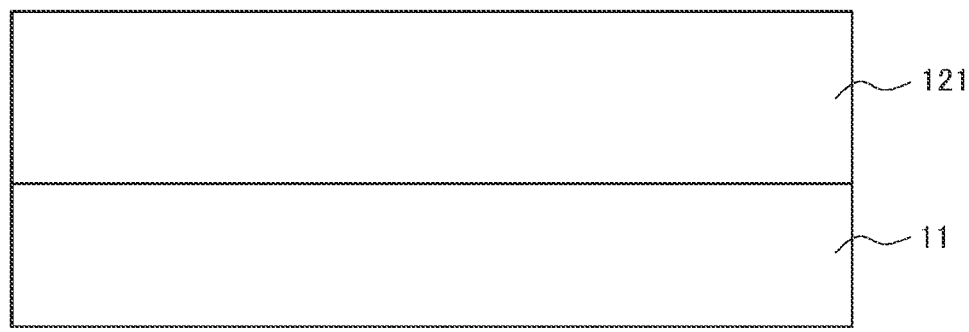

As illustrated in FIGS. 2A and 2B, a planar growth layer 121 is formed by epitaxially growing (growing two dimensionally) AlN like a plate on the {0001} plane of the substrate, whereby a template 10A in the first example is formed. In this example, the planar growth layer 121 corresponds to the template layer 12 in FIG. 1.

The size of the top surface of the substrate 11 on which the planar growth layer 121 is grown is preferably approximately equal to or larger than a square with 5 mm×5 mm, and approximately equal to or smaller than a circle with a diameter of 4 inches (about 10 mm). The thickness of the substrate 11 is preferably 100 μm or more and 1000 μm or less.

For example, TMA (trimethyl aluminum) and $NH_3$ can be used as a material for growing the planar growth layer 121 on the substrate 11. In this case, the growth temperature is preferably set as 1000° C. or more and 1400° C. or less, and the pressure is preferably set as 10 torr or more and 760 torr or less. The thickness of the planar growth layer 121 formed on the substrate 11 is preferably 1 μm or more and 20 μm or less.

A layer having another composition such as AlGaN may be formed on any timing in the period from the formation of the planar growth layer 121 till the completion of the formation. When the layer of AlGaN is formed in this example, a material such as TMG (trimethyl gallium) or TEG (triethyl gallium) may be added in the material (e.g., TMA and $NH_3$) for forming AlN to make a crystal growth. Instead of TMA, TEA (triethyl aluminum) can be used.

Second Example

Figure 3A:
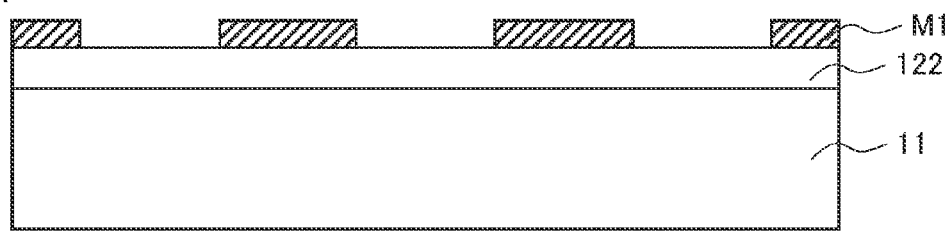
FIG. 3 is a schematic side view illustrating a manufacturing process of a template in a second example.

As illustrated in FIG. 3A, AlN is epitaxially grown on the {0001} plane of the substrate to form an initial layer 122 in this example. A stripe-like mask M1 extending in the depth direction of the drawing is formed, for example, on the top surface of the formed initial layer 122 by utilizing a known photolithography technique. The mask M1 is preferably formed by using Ni or Ti. The preferable condition of the substrate 11 is the same as the template 10A in the first example. The preferable condition of the initial layer 122 is the same as the planar growth layer 121 of the template 10A in the first example.

Figure 3B:
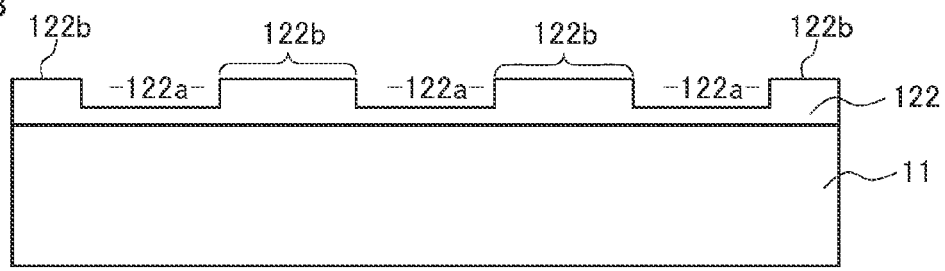

Next, the portion on the initial layer 122 on which the mask M1 is not formed is removed by RIE (Reactive Ion Etching), particularly ICP (Inductive Coupled Plasma) etching. Thus, stripe-like concave portions 122a and convex, portions 122b are formed on. the initial layer 122 as illustrated in FIG. 3B. The size of the concave portion 122a and the convex portion 122b (the space between the masks M1 and the width of the stripe) is preferably 100 nm or more and 10 μm or less. The size of the concave portion 122a in the vertical direction (the etched depth) is preferably 300 nm or more and 3 μm or less. FIG. 3B illustrates that the etching depth is smaller than the thickness of the initial layer 122. However, the etching depth may be larger than the thickness of the initial layer 122 (the top surface of the substrate 11 maybe etched).

Figure 3C:
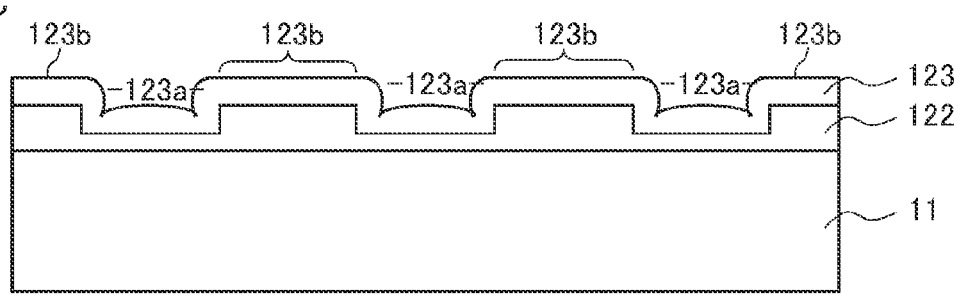
Figure 3D:
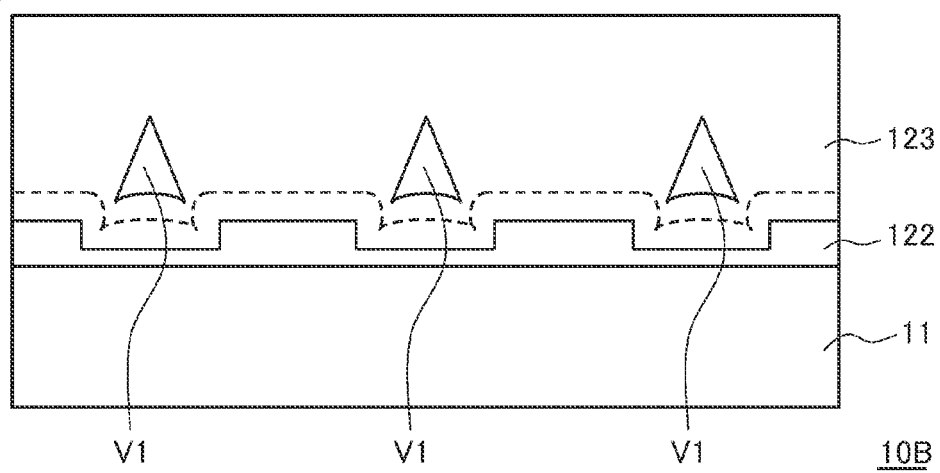

As illustrated in FIGS. 3C and 3D, AlN is epitaxially grown on the top surface of the substrate 11 and the initial layer 122 illustrated in FIG. 3B. With this, an ELO (Epitaxial Lateral Overgrowth) layer 123 is formed, whereby a template 10B is formed. In this example, the initial layer 122 and the ELO layer 123 correspond to the template layer 12 in FIG. 1.

When the ELO layer 123 is grown on the structure having irregularities described above, a portion 123b growing from the top surface of the convex portion 122b covers the concave portion 122a from above, whereby the top surface of the ELO layer 123 becomes finally flat. When the portions 123b of the ELO layer 123 growing from the top surface of the adjacent convex portions 122b are assembled with each other above the concave portion 122a present between the convex portions 122b, they can form a stripe-like void V1 between the assembled portion and the portion 123a growing from the concave portion 122a. The preferable condition of the ELO layer 123 is the same as the planar growth layer 121 of the template 10A in the first example.

Dislocation in a crystal is propagated along the growing direction of the crystal. Therefore, in the ELO layer 123, the dislocation density in the upper part of the portion growing in the lateral direction decreases more than the dislocation density when the crystal is simply grown in the vertical direction. Accordingly, the formation of the ELO layer 123 can enhance crystalline character on the top surface of the template 10B, resulting in that the crystalline character of the stacked layer portion 21 formed on the top surface can be enhanced.

FIG. 3A illustrates that the stripe-like mask M1 is formed. However, a mask having another shape, such as a rectangular mask or hexagonal mask, may be formed. The size of the concave portion 122a and the size of the convex portion 122b may be equal to each other, or may be different from each other.

A layer having another composition such as AlGaN may be formed on any timing in the period from the formation of the initial layer 122 fill the completion of the formation, or in the period from the beginning of the formation of the ELO layer 123 till the completion of the formation. When the layer of AlGaN is formed in this example, a material such as TMG or TEG may be added in the material (e.g., TMA or TEA and $NH_3$) for forming AlN to make a crystal growth.

Third Example

Figure 4A:
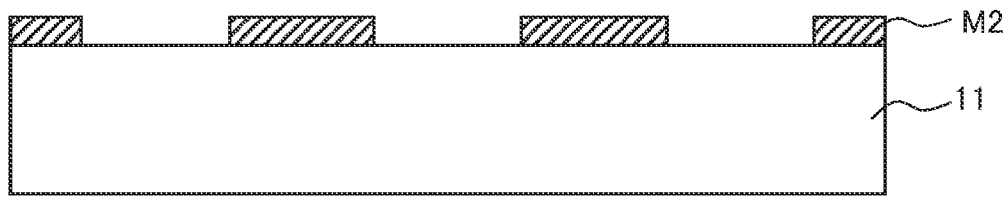
FIG. 4 is a schematic side view illustrating a manufacturing process of a template in a third example.

As illustrated in FIG. 4A, a stripe-like mask M2 extending in the depth direction of the drawing is formed, for example, on the {0001} plane of the substrate by utilizing a known photolithography technique in this example. The mask M2 is preferably formed by using Ni or Ti. The preferable condition of the substrate 11 is the same as the template 10A in the first example.

Figure 4B:
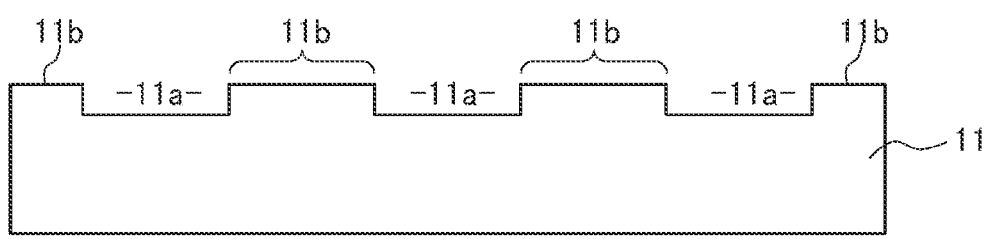

Next, the portion on the substrate 11 on top surface of which the mask M2 is not formed is removed by RIE, particularly ICP etching. Thus, stripe-like concave portions 11a and convex portions 11b are formed on the substrate 11 as illustrated in FIG. 4B. The preferable condition of the concave portion 11a and the convex portion 11b is the same as the concave portion 121a and the convex portion 121b of the template 10B in the second example.

Figure 4C:
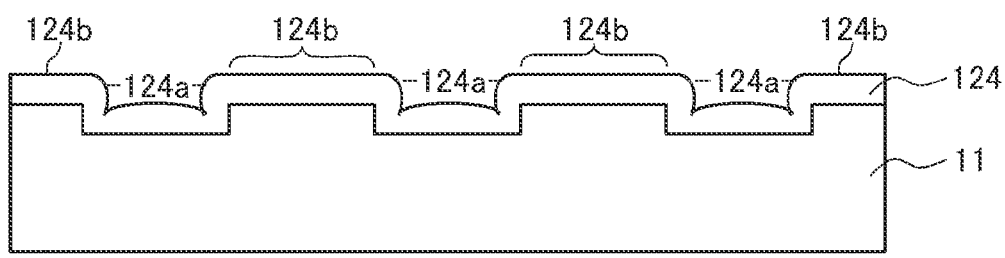
Figure 4D:
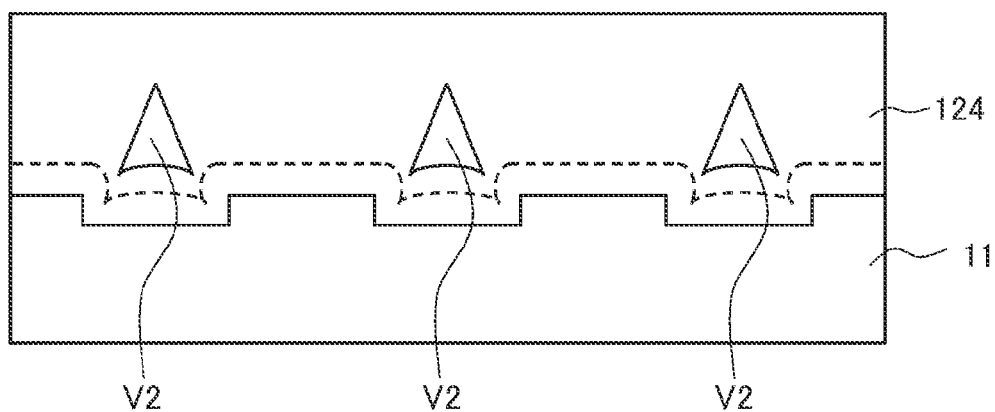

As illustrated in FIGS. 4C and 4B, AlN is epitaxially grown on the top surface of the substrate 11 illustrated in FIG. 4B. With this, an ELO layer 124 is formed, whereby a template 10C is formed. In this example, the ELO layer 124 corresponds to the template layer 12 in FIG. 1.

When the ELO layer 124 is grown on the structure having irregularities described above, the growth same as the growth of the ELO layer 123 of the template 10B in the second example is generated. Specifically, the top surface of the ELO layer 124 finally becomes flat, and the ELO layer 124 can include a stripe-like void V2. The preferable condition of the ELO layer 124 is the same as the planar growth layer 121 of the template 10A in the first example.

In the template 10C in this example, the ELO layer 124 is formed as in the template 10B in the second example. Accordingly, the crystalline character on the top surface of the template 10C can be enhanced, resulting in that the crystalline character of the stacked layer portion 21 formed on the top surface can be enhanced.

FIG. 4A illustrates that the stripe-like mask M2 is formed. However, a mask having another shape, such as a rectangular mask or hexagonal mask, may be formed. The size of the concave portion 11a and the size of the convex portion 11b may be equal to each other, or may be different from each other.

A layer having another composition such as AlGaN may be formed on any timing in the period from the formation of the ELO layer 124 till the completion of the formation. When the layer of AlGaN is formed in this example, a material such as TMG or TEG may be added in the material (e.g., TMA or TEA and $NH_3$) for forming AlN to make a crystal growth.

The templates 10A to 10C in the first to the third examples described above are common in that the layer (the whole of or a part of the planar growth layer 121, the initial layer 122, and the ELO layer 124) made of AlN are formed on the top surface of the substrate 11. In the description below, the layer made of AlN is collectively referred to as "AlN layer".

(Device Structure Portion Manufacturing Process)

Figure 5:
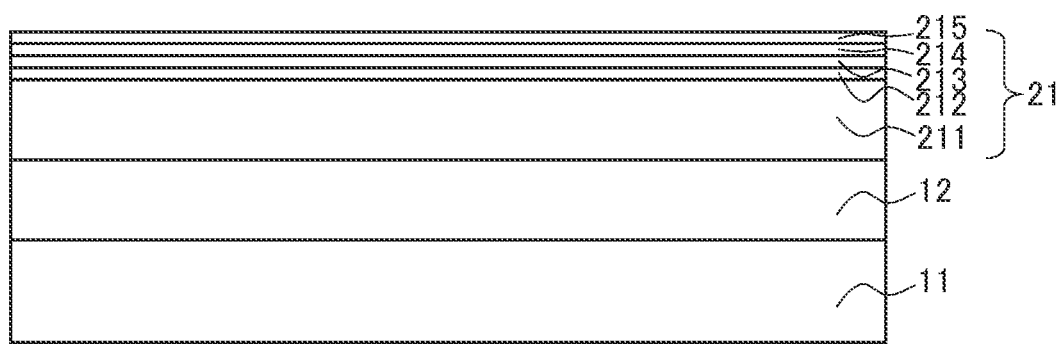
FIG. 5 is a schematic side view illustrating one example of a stacking process included in a manufacturing process of a device structure portion.
Figure 8:
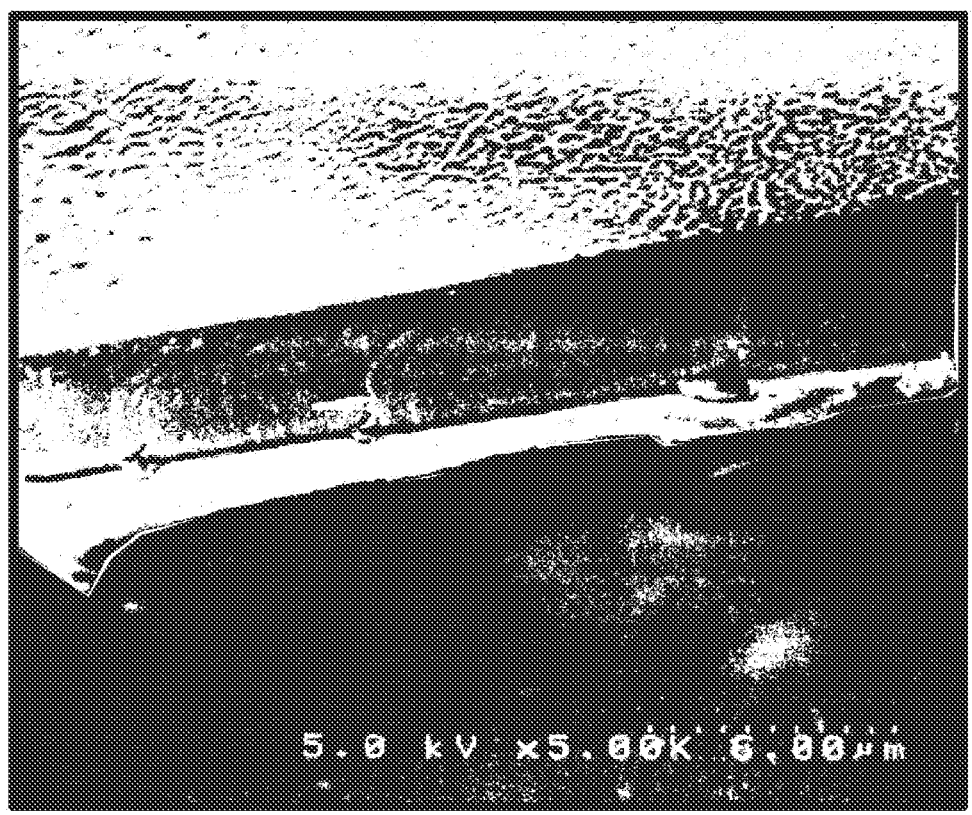
FIG. 8 is an SEM photograph (overhead view) illustrating a state in which a substrate is lifted off from a chip having the template in the first example in a manufacturing method of a semiconductor device according to a first embodiment.

The manufacturing process of the device structure portion 20 formed on the top surface of the template 10 illustrated in FIG. 1 will be described with reference to FIGS. 5 and 6. FIG. 5 is a schematic side view illustrating one example of a stacking process included in the manufacturing process of the device structure portion. FIG. 8 is a schematic side view illustrating one example of an electrode forming process and a chip dividing process included in the manufacturing process of the device structure portion.

As illustrated in FIG. 5, an n-type AlGaN is epitaxially grown on the top surface of the template layer 12 so as to form an n-type clad layer 211. Then, a barrier layer made of AlGaN and a well layer made of AlGaN having a composition ratio of Al different from that of the barrier layer, are epitaxially grown alternately on the top surface of the n-type clad layer 211, whereby a multiquantum well active layer 212 is formed. The lowermost layer and the uppermost layer of the multiquantum well active layer 212 are the barrier layers, and the multiquantum well active layer 212 includes four barrier layers and three well layers, for example.

Next, p-type AlGaN is epitaxially grown on the top surface of the multiquantum well active layer 212 to form an electron blocking layer 213. Further, p-type AlGaN is epitaxially grown on the top surface of the electron, blocking layer 213 to form a p-type clad layer 214. On the top surface of the p-type clad layer 214, p-type GaN is epitaxially grown to form a contact layer 215.

The thickness and Al composition ratio of each of the layers 211 to 215 can be set according to a characteristic of light that is to be emitted. However, it is preferable that the Al composition ratio of the n-type clad layer 211 is larger than the Al composition ratio of the barrier layer, and the Al composition, ratio of the barrier layer is larger than the Al composition ratio of the well layer. It is also preferable that the Al composition ratio of the electron blocking layer 213 and the p-type clad layer 214 is larger than the Al composition ratio of the barrier layer, and the Al composition ratio of the contact layer 215 is smaller than the Al composition ratio of the p-type clad layer 214.

For example, the thickness and the Al composition ratio of the n-type clad layer are 2 μm and 70%, the thickness and the Al composition ratio of the barrier layer in the multiquantum well active layer 212 are 8 nm and 50%, the thickness and the Al composition ratio of the well layer are 3 nm and 40%, the thickness and the Al composition ratio of the electron blocking layer 213 are 20 nm and 60%, the thickness and the Al composition ratio of the p-type clad layer 214 are 200 nm and 60%, and the thickness and the Al composition ratio of the contact layer 215 are 10 nm and 0%.

It is preferable that Si is used as a dopant to make the AlGaN semiconductor layer n-type. In this case, SiBU (silane) may be fed during the growth of the AlGaN semiconductor layer that should be made n-type. It is also preferable that Mg is used as a dopant to make the AlGaN semiconductor layer p-type. In this case, $Cp_2Mg$ (cyclopentadienyl magnesium) may be fed during the growth of the AlGaN semiconductor layer that should be made p-type.

Figure 6A:
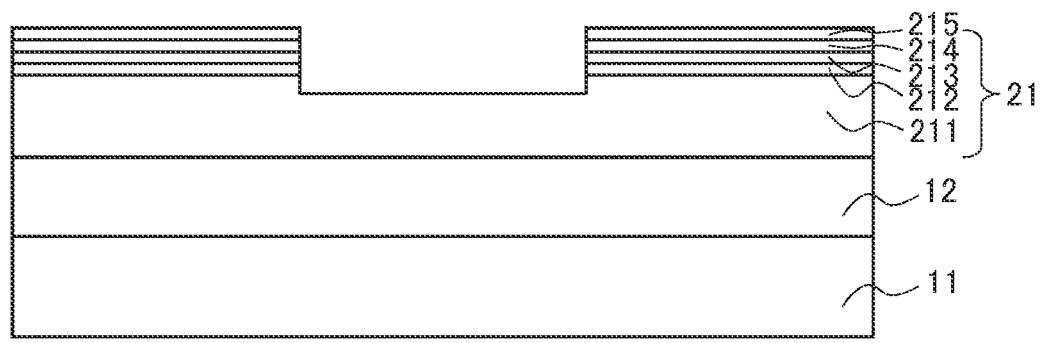
FIG. 6 is a schematic side view illustrating one example of an electrode forming process and a chip dividing process included in the manufacturing process of the device structure portion.

Next, as illustrated in FIG. 6A, a part of a region of the stacked structure illustrated in FIG. 5 is etched in the downward direction from the contact layer 215 to reach the n-type clad layer 211, whereby the n-type clad layer 211 is exposed. In this case, it is preferable that the etching (RIE, especially ICP) similar to the etching in the manufacturing process of the template is used.

Figure 6B:
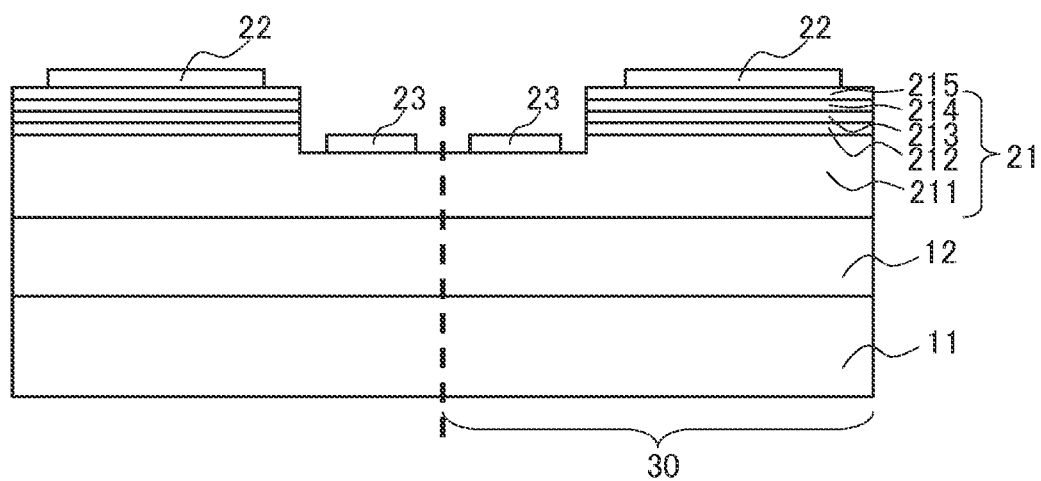

As illustrated in FIG. 6B, a p-side electrode (anode electrode) 22 is formed on the top surface (contact layer 215) in the region where the etching is not carried out. An n-side electrode (cathode electrode) 23 is formed on the top surface (n-type clad, layer 211) in the region where the etching is carried out.

As the p-side electrode 22, a Ni/Au multilayer film formed by the formation of Ni and Au in this order from the contact layer 215 may be employed, for example, As the n-side electrode 23, a Ti/Al/Ti/Au multilayer film formed by the formation of Ti, Al, Ti, and Au in this order from the exposed n-type clad layer 211 may be employed, for example. The p-side electrode 22 and the n-side electrode 23 can be formed by a known film forming technique such as EB (Electron Beam) evaporation or sputtering. The p-side electrode 22 and the n-side electrode 23 are not limited to the multilayer film described above. They may be a single layer film, or a synthetic film formed by mixing (e.g., alloying) plural types of elements. For example, the p-side electrode 22 and the n-side electrode 23 may contain at least one of Ti, Al, Ni, Au, Pt, Pd, Cr, Mo, and Rh, or may contain ITO (indium tin oxide), IZO (indium zinc oxide), or APC (alloy of Ag, Pd, and Cu).

A chip dividing process (dicing) is carried out according to need, after the p-side electrode 22 and the n-side electrode 23 are formed. The chip dividing process is a process of cutting a structure (including the template 10 and the device structure portion 20, the same applies to the description below) in the form of the wafer in the vertical direction in a unit of an element. In the example in FIG. 6B, the structure is cut along a broken line (the portion between the adjacent n-side electrodes 23). The cutting position in FIG. 6B is only illustrative, and the structure may be cut in any manner, so long as one chip 30 obtained by the chip dividing process includes at least one p-side electrode 22 and one n-side electrode 23.

The chip dividing process can be done by use of a scriber having a blade made of diamond, for example. In the chip dividing process, the structure may not completely be cut (e.g., a part of the substrate 11 is half cut to keep the wafer state without cutting a part of the substrate 11, and the template layer 12 and the device structure portion 20 are cut in a unit of an element). The chip dividing process may be carried out after a fixing process and a lift-off process of the substrate 11, described later. When the structure excluding the substrate 11 is divided into a chip after the later-described lift-off process of the substrate 11, the structure may be cleaved to be cut.

(Fixing Process)

Figure 7:
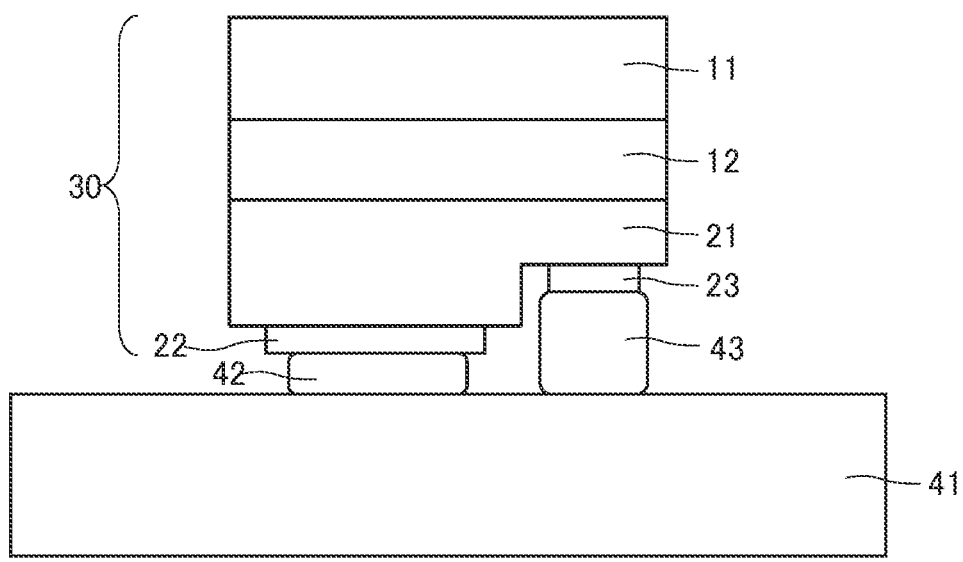
FIG. 7 is a schematic side view illustrating one example of a fixing process.

Next, a fixing process of a chip will be described with reference to FIG. 7. FIG. 7 is a schematic side view illustrating one example of the fixing process. FIG. 7 illustrates the fixing process of mounting the chip 30 to a mounting substrate 41 by a flip-chip assembly.

As illustrated in FIG. 7, a p-side bump 42 that is to be connected to the p-side electrode 22 on the chip 30 and an n-side bump 43 that is to be connected to the n-side electrode 23 on the chip 30 are provided on a predetermined surface (the upper surface in FIG. 7, and hereafter referred to as a mounting surface) of the mounting substrate 41. Electric power is fed to the p-side electrode 22 and the n-side electrode 23 on the chip 30 from a power source (not illustrated) via the mounting substrate 41, the p-side bump 42, and the n-side bump 43, respectively. The p-side electrode 22 and the n-side electrode 23 on the chip 30 and the p-side bump 42 and the n-side bump 43 on the mounting surface of the mounting substrate 41 are bonded by a die bonding, for example. Thus, the chip 30 is fixed on the mounting substrate 41.

The p-side bump 42 and the n-side bump 43 preferably contain Au. The p-side electrode 22 and the n-side electrode 23 on the chip 30 and the mounting substrate 41 may be electrically connected by a wire bonding, or the chip 30 may be mounted on the mounting substrate 41 in a face-up style.

The chip 30 may be fixed on a support, member other than the mounting substrate 41. For example, the chip 30 may be fixed on a temporary fixing tape, and the like. The structure in the form of the wafer may be fixed on the mounting substrate 41 or on the support member such as the fixing tape.

(Lift-off Process of Substrate)

A lift-off process of the substrate 11 in the first embodiment will be described below with reference to the drawings. In order to embody the description, a semiconductor device obtained by a process in which the chip 30 illustrated in FIG. 7 is fixed on the mounting substrate 41, and the substrate 11 is lifted off, will be described.

As described above, the AlN layer is formed on the top surface of the substrate 11 (see FIGS. 2 to 4). In the lift-off process of the substrate 11 in the present embodiment, laser light with a wavelength by which the laser light passes through the substrate 11 and is absorbed by AlN is emitted from the side close to the substrate 11 of the chip 30. When the substrate 11 is made of sapphire, for example, the wavelength of the laser light is preferably 200 nm or less. The laser light described above can be emitted from ArF excimer laser (wavelength: 193 nm). An $F_2$ excimer laser (wavelength: 157 nm) can also emit the laser light described above. A laser device that has a light source with an emission wavelength of 200 nm or more but can utilize harmonic conversion can emit the laser light with a wavelength of 200 nm or less.

When the laser light described above is emitted from the side close to the substrate 11 of the chip 30, the AlN layer formed on the top surface (the lower surface in FIG. 7) of the substrate 11 absorbs the laser light. In this case, the AlN layer generates heat by the absorbed energy. Therefore, the AlN layer greatly expands more than the top surface of the substrate 11 on at least the interface between the AlN layer and the substrate 11. In this case, when the AlN layer receives compressive stress from the substrate 11 before the irradiation of the laser light, the compressive stress increases more with the thermal expansion of the AlN layer. When the compressive stress increases to an extent by which the bonding between the AlN layer and the substrate 11 cannot be maintained, the substrate 11 is lifted off from the AlN layer.

Specifically, when the substrate 11 is made of sapphire whose thermal expansion coefficient is larger than that of AlN, the substrate 11 is greatly shrunk more than the AlN layer due to the temperature drop after the formation of the AlN layer on the substrate 11. Therefore, the substrate 11 applies compressive stress of 10 MPa or more to the AlN layer. When the laser light is emitted to the AlN layer from the side close to the substrate 11 of the chip 30, the compressive stress received by the AlN layer from the substrate 11 increases up to 2 GPa or more. Accordingly, the bonding between the AlN layer and the substrate 11 cannot be maintained, so that the substrate 11 is lifted off from the AlN layer.

According to the manufacturing method of the semiconductor device in the present embodiment, the substrate 11 can be lifted off from the AlN layer by utilizing a mechanism (increase in compressive stress) that is different from a mechanism (deposition and melting of Ga) for lifting off the substrate from a GaN layer. Since the substrate 11 can be lifted off from the AlN layer formed on the surface of the substrate 11, the formation of a special, layer for the lift-off in the template layer 12 or the device structure portion 21 is not needed. Therefore, the substrate 11 can easily be lifted off. By lifting off the substrate 11, the heat radiation performance of the device structure portion 20 can be enhanced, the efficiency of extracting light generated on the device structure portion 20 can be enhanced, and a vertical structure can be realized.

It is preferable that the output (energy density) of the laser light emitted during the lift-off process of the substrate 11 is 0.6 J/cm$^2$ or more and 4 J/cm$^2$ or less, since the substrate 11 can be well lifted off by this range.

A specific example of the semiconductor device obtained by the manufacturing method of the semiconductor device according to the first embodiment will be described with reference to FIGS. 8 to 13.

Figure 9A:
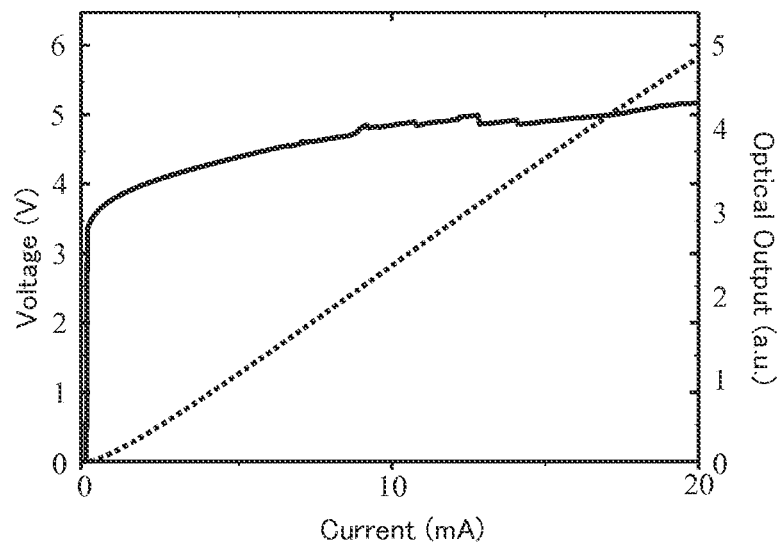
FIG. 9 is a graph illustrating an optical characteristic and electric characteristic when the semiconductor device illustrated in FIG. 8 is driven.
Figure 9B:
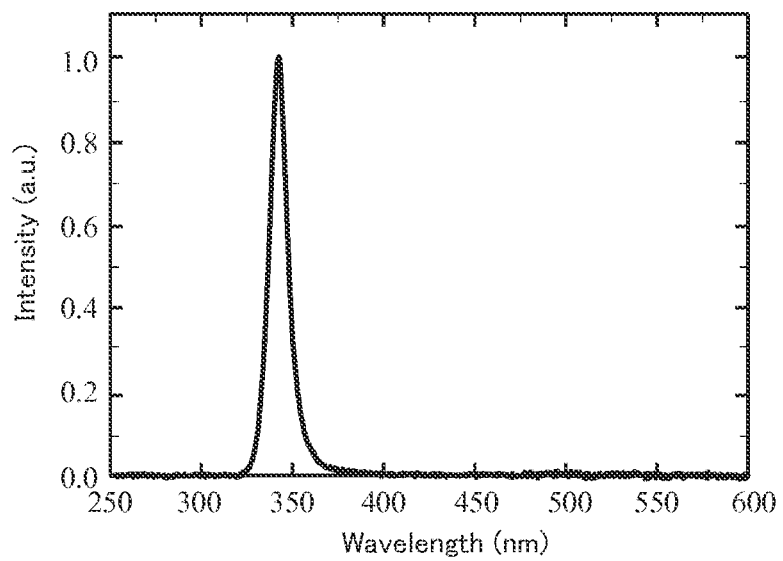

FIGS. 8 and 9 illustrate a result after the lift-off process of the substrate is carried out to the chip having the template 10A (see FIG. 2) in the first example. FIG. 8 is an SEM photograph (overhead view) illustrating the state in which the substrate is lifted off from the chip having the template in the first example. It illustrates the state in which the AlN layer (the planar growth, layer that is the upper layer in the figure) is exposed by the lift-off. FIG. 9 is a graph illustrating an optical characteristic and electric characteristic when the semiconductor device illustrated in FIG. 8 is driven. FIG. 9A is a graph respectively illustrating an applied voltage and optical output according to the applied current, wherein a solid line indicates the applied voltage, and a broken line indicates the optical output. FIG. 9B is a graph illustrating a wavelength characteristic of an intensity of light emitted when the semiconductor device is driven.

As illustrated, in FIG. 8, the substrate can be lifted off from the AlN layer without giving fatal damage to the device structure portion by-employing the above-mentioned lift-off process. Therefore, the obtained semiconductor device (light-emitting diode) can normally be driven (can normally emit light) as illustrated in FIG. 9.

Figure 10:
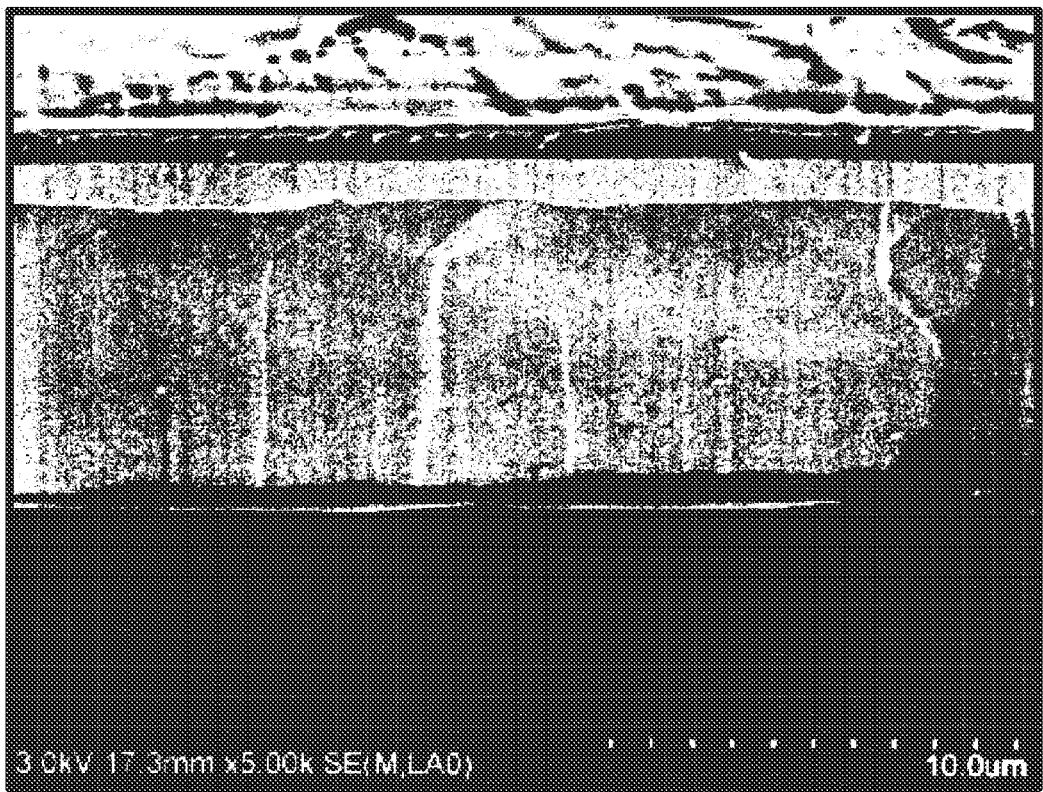
FIG. 10 is an SEM photograph, (overhead view) illustrating a state in which a substrate is lifted off from a chip having the template in the second example in a manufacturing method of a semiconductor device according to the first embodiment.
Figure 11A:
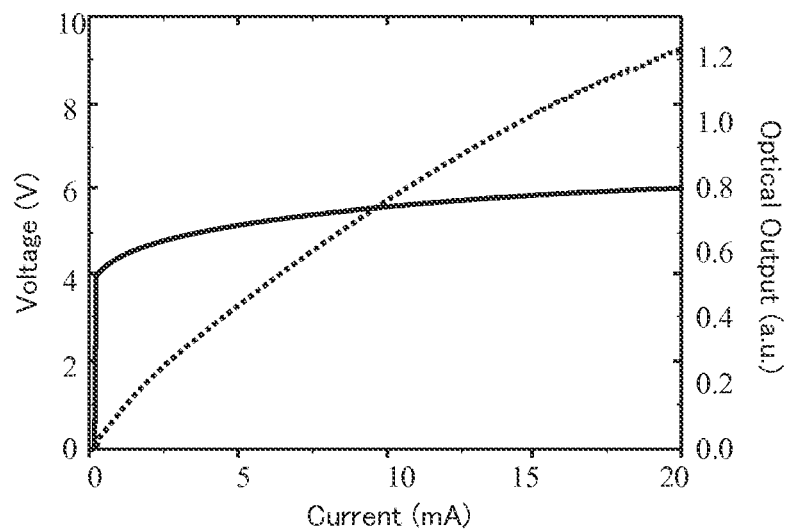
FIG. 11 is a graph illustrating an optical characteristic and electric characteristic when the semiconductor device illustrated in FIG. 10 is driven.
Figure 11B:
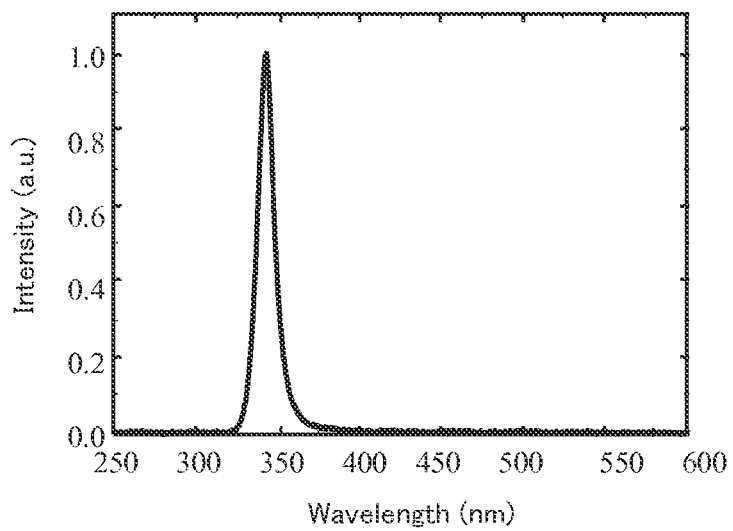

FIGS. 10 and 11 illustrate a result after the lift-off process of the substrate is carried out to the chip having the template 10B (see FIG. 3) in the second example. FIG. 10 is an SEM photograph (overhead view) illustrating the state in which the substrate is lifted off from the chip having the template in the second example. It illustrates the state in which the AlN layer (the initial layer that is the upper layer in the figure) is exposed by the lift-off. FIG. 11 is a graph illustrating an optical characteristic and electric characteristic when the semiconductor device illustrated in FIG. 10 is driven. FIG. 11A is a graph respectively illustrating an applied voltage and optical output according to the applied current, wherein a solid line indicates the applied voltage, and a broken line indicates the optical output. FIG. 11B is a graph illustrating a wavelength characteristic of an intensity of light emitted when the semiconductor device is driven.

As illustrated in FIG. 10, the substrate can be lifted off from the AlN layer without giving fatal damage to the device structure portion by employing the above-mentioned, lift-off process. Therefore, the obtained semiconductor device (light-emitting diode) can normally be driven (can normally emit light) as illustrated in FIG. 11.

Figure 12:
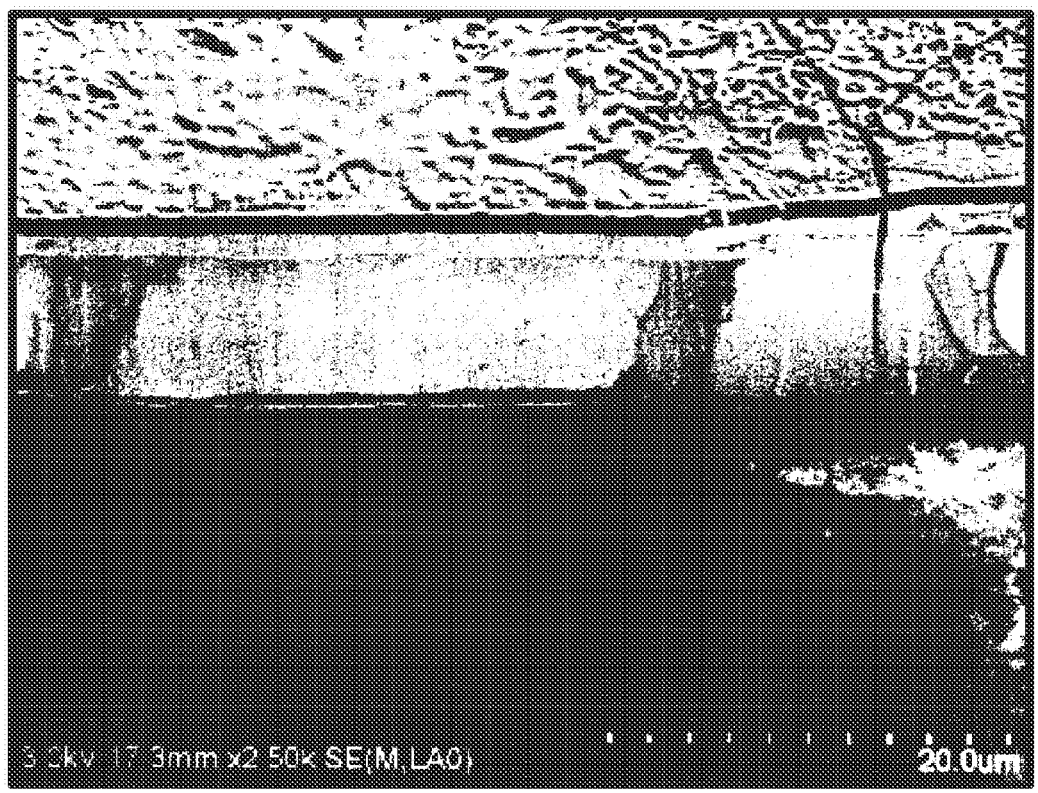
FIG. 12 is an SEM photograph (overhead view) illustrating a state in which a substrate is lifted off from a chip having the template in the third example in a manufacturing method of a semiconductor device according to the first embodiment.
Figure 13A:
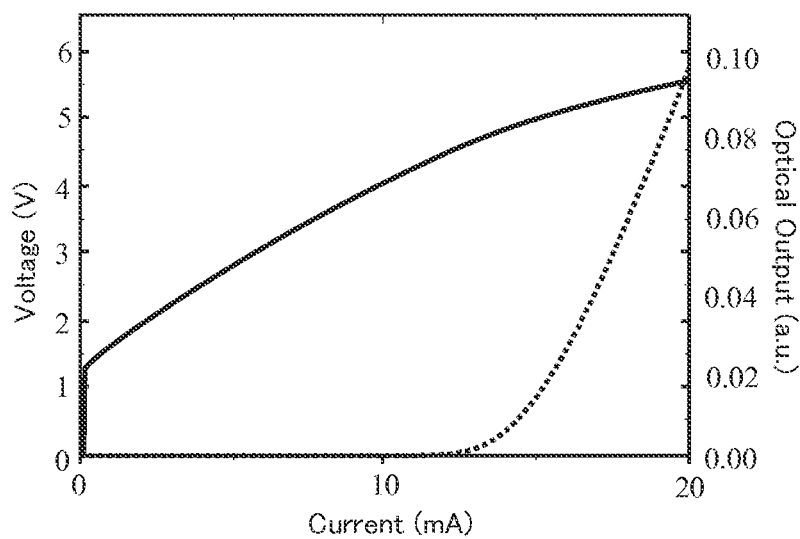
FIG. 13 is a graph illustrating an optical characteristic and electric characteristic when the semiconductor device illustrated in FIG. 12 is driven.
Figure 13B:
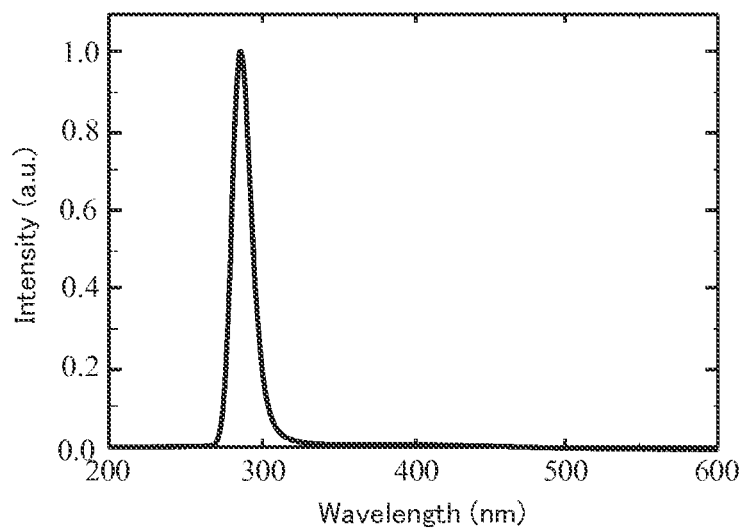

FIGS. 12 and 13 illustrate a result after the lift-off process of the substrate is carried out to the chip having the template 10C (see FIG. 4) in the third example. FIG. 12 is an SEM photograph (overhead view) illustrating the state in which the substrate is lifted off from the chip having the template in the third example. It illustrates the state in which the AlN layer (the ELO layer that is the upper layer in the figure) is exposed by the lift-off. FIG. 13 is a graph illustrating an optical characteristic and electric characteristic when the semiconductor device illustrated in FIG. 12 is driven, FIG. 13A is a graph respectively illustrating an applied voltage and optical output according to the applied current, wherein a solid line indicates the applied voltage, and a broken line indicates the optical output. FIG. 13B is a graph illustrating a wavelength characteristic of an intensity of light emitted when the semiconductor device is driven.

As illustrated in FIG. 12, the substrate can be lifted off from the AlN layer without giving fatal damage to the device structure portion by employing the above-mentioned lift-off process. Therefore, the obtained semiconductor device (light-emitting diode) can normally be driven (can normally emit light) as illustrated in FIG. 13.

<Second Embodiment>

A second embodiment of the manufacturing method of a semiconductor device will be described below with reference to the drawings. The processes other than the process (the lift-off process of the substrate) described in the first embodiment are the same in the present embodiment. Therefore, the corresponding process in the first embodiment is referred to, and the detailed description will not be repeated.

(Cavity Expanding Process)

In the manufacturing method of the semiconductor device according to the present embodiment, a cavity expanding process for expanding the cavities V1 and V2 (see FIGS. 3 and 4) is carried out before the lift-off process of the substrate 11. The cavity expanding process is carried out by an etching (wet etching) using predetermined solvent, for example. It is preferable that the cavities V1 and V2 have the stripe shape as described above, because this structure allows the ends of the cavities V1 and V2 to be exposed on the end face of the chip, whereby the solvent is easy to enter the cavities V1 and V2, which realizes effective etching.

It is also preferable that the cavities V1 and V2 are expanded to reach the top surface of the substrate 11 in the cavity expanding process. KOH is preferably used as the solvent for carrying out the cavity expanding process. It is preferable that the concentration of KOH is set as 1 mol/l or more and 8 mol/l or less, the immersion temperature is set as room temperature or higher and 150° C. or lower, and the immersion time is set as 30 seconds or longer and one day or shorter, since these conditions can allow the cavities V1 and V2 to be sufficiently expanded.

(Lift-off Process of Substrate)

The lift-off process of the substrate 11 in the present embodiment is similar to the lift-off process in the first embodiment. Specifically, in the lift-off process of the substrate 11 in the present embodiment, laser light with a wavelength by which the laser light passes through the substrate 11 and is absorbed by AlN is emitted from the side close to the substrate 11 of the chip 30. The part of the lift-off process in the first embodiment same as the lift-off process in the present embodiment is referred to, and the detailed description will not be repeated.

According to the manufacturing method of the semiconductor device in the present embodiment, the substrate 11 can be lifted off from the AlN layer by utilizing a mechanism (increase in compressive stress) that is different from a mechanism (deposition and melting of Ga) for lifting off the substrate from a GaN layer. Since the substrate 11 can be lifted off from the AlN layer formed on the surface of the substrate 11, the formation of a special layer for the lift-off in the template layer 12 or the device structure portion 21 is not needed. Therefore, the substrate 11 can easily be lifted off. By lifting off the substrate 11, the heat radiation performance of the device structure portion 20 can be enhanced, the efficiency of extracting light generated on the device structure portion 20 can be enhanced, and a vertical structure can be realized.

According to the manufacturing method of a semiconductor device in the present embodiment, the template layer 12 whose surface is a rough surface (moth-eye structure) by the cavity expanding process can be exposed only by lifting off the substrate 11. Because of the moth-eye structure on the surface of the template layer 12, the reflection of light that is generated on the stacked layer portion 21 and is to be emitted to the outside through the template layer 12 can be prevented, compared to the case where the surface of the template layer 12 is flat. Specifically, light use efficiency can be enhanced. The moth-eye structure on the surface of the template layer 12 can reduce the bonding area between the template layer 12 and the substrate 11. Therefore, the substrate 11 is easy to be lifted off from the template layer 12. This structure can also reduce impact applied to the device structure portion 20 upon lifting off the substrate 11.

It is preferable that the output (energy density) of the laser light emitted during the lift-off process of the substrate 11 in the present embodiment is 0.3 J/cm$^2$ or more and 4 J/cm$^2$ or less, since the substrate 11 can be well lifted off by this range.

A specific example of the semiconductor device obtained by the manufacturing method of the semiconductor device according to the second embodiment will be described with reference to FIGS. 14 to 19.

Figure 14:
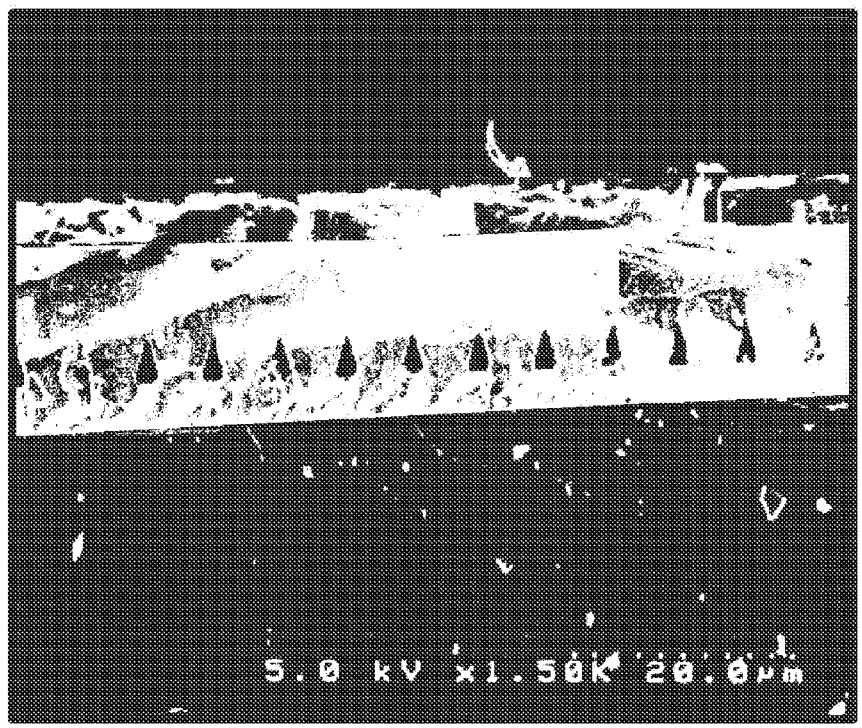
FIG. 14 is an SEM photograph (side view) illustrating a state of a chip having the template in the second example before and after a cavity expanding process in a manufacturing method of a semiconductor device according to a second embodiment.
Figure 14:
Figure 15:
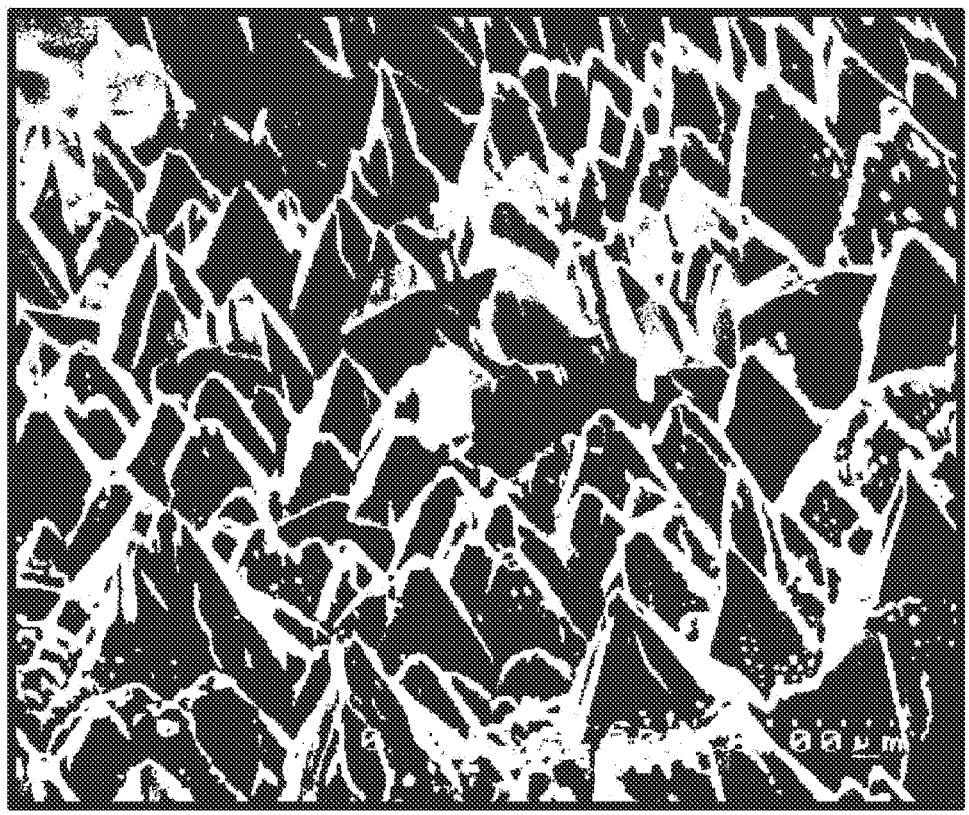
FIG. 15 is an SEM photograph (overhead view) illustrating a state in which a substrate is lifted off from a chip having the template in the second example in a manufacturing method of a semiconductor device according to the second embodiment.
Figure 16A:
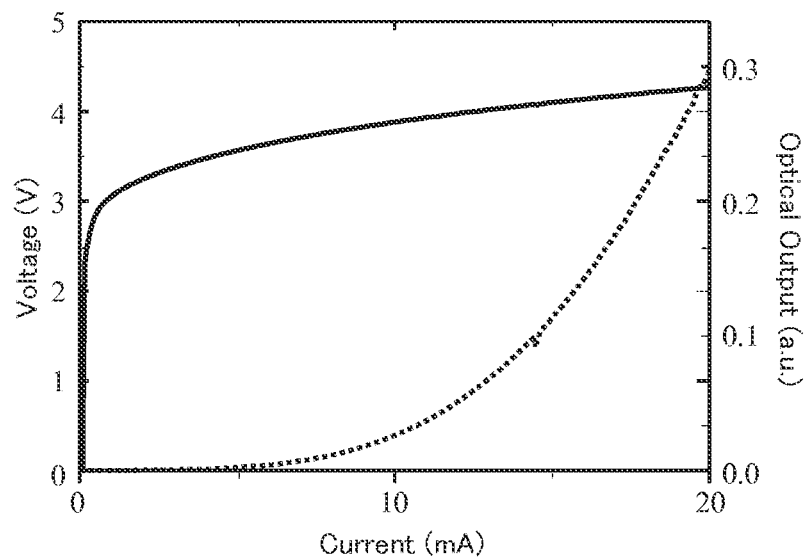
FIG. 16 is a graph illustrating an optical characteristic and electric characteristic when the semiconductor device illustrated in FIG. 15 is driven.
Figure 16B:
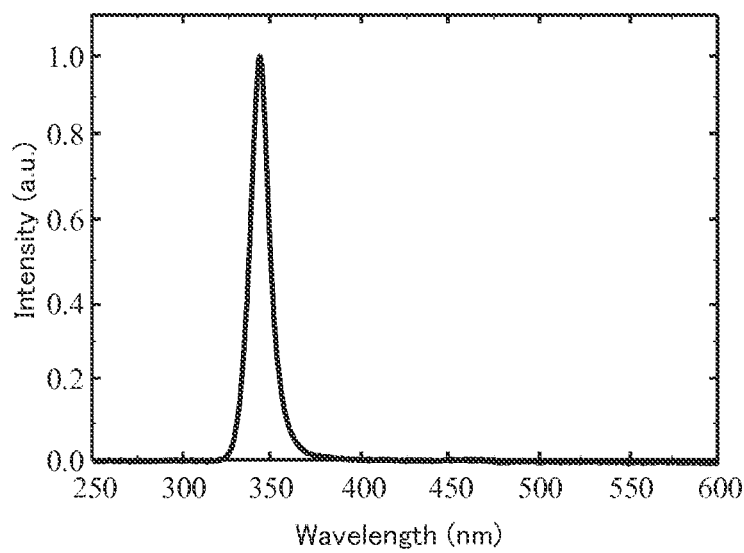

FIGS. 14 to 16 illustrate a result after the cavity expanding process and the lift-off process of the substrate are carried out to the chip having the template 10B (see FIG. 3) in the second example. FIG. 14 is an SEM photograph (side view) illustrating a state of the chip having the template in the second example before and after the cavity expanding process. FIG. 15 is an SEM photograph (overhead view) illustrating the state in which the substrate is lifted off from the chip having the template in the second example. It illustrates the state in which the AlN layer (the initial layer that is the upper layer in the figure) is exposed by the lift-off. FIG. 16 is a graph illustrating an optical characteristic and electric characteristic when the semiconductor device illustrated in FIG. 15 is driven. FIG. 16A is a graph respectively illustrating an applied voltage and optical output according to the applied current, wherein a solid line indicates the applied voltage, and a broken line indicates the optical output. FIG. 16B is a graph illustrating a wavelength characteristic of an intensity of light emitted when the semiconductor device is driven. In the present embodiment, the chip is immersed in KOH of 80° C. for 60 minutes in the cavity expanding process.

As illustrated in FIG. 14, a part of the template layer is etched, and the cavity is expanded in the cavity expanding process. The cavity is expanded to reach the top surface of the substrate. Therefore, when the substrate is lifted off, the template layer having the moth-eye structure is exposed as illustrated in FIG. 15. As illustrated in FIG. 15, the substrate can be lifted off from the AlN layer without giving fatal damage to the device structure portion by employing the above-mentioned lift-off process. Therefore, the obtained semiconductor device (light-emitting diode) can normally be driven (can normally emit light) as illustrated in FIG. 16.

Figure 17:
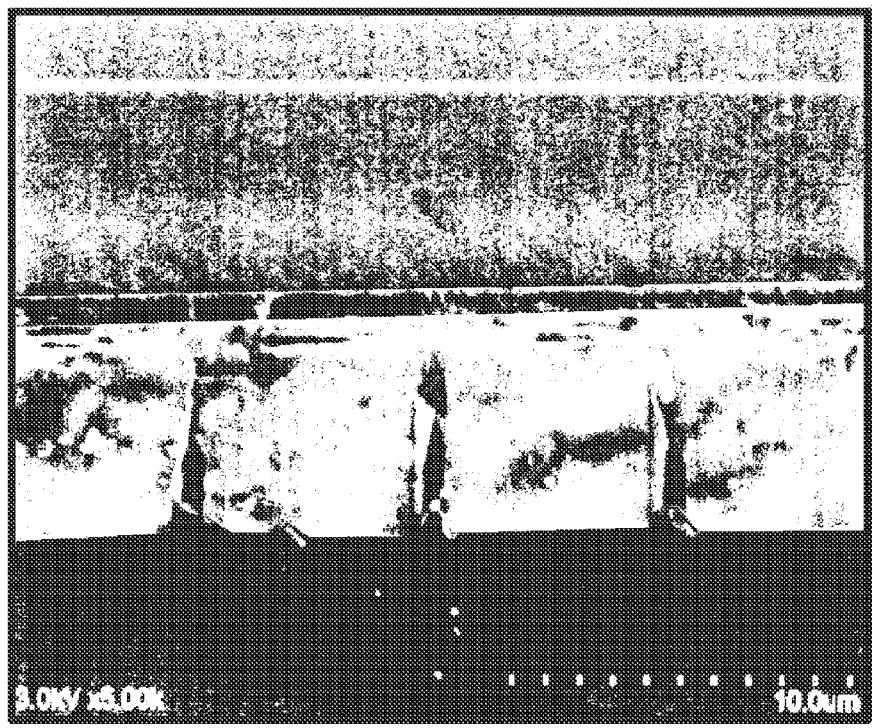
FIG. 17 is an SEM photograph (side view) illustrating a state of a chip having the template in the third example before and after a cavity expanding process in a manufacturing method of a semiconductor device according to the second embodiment.
Figure 17:
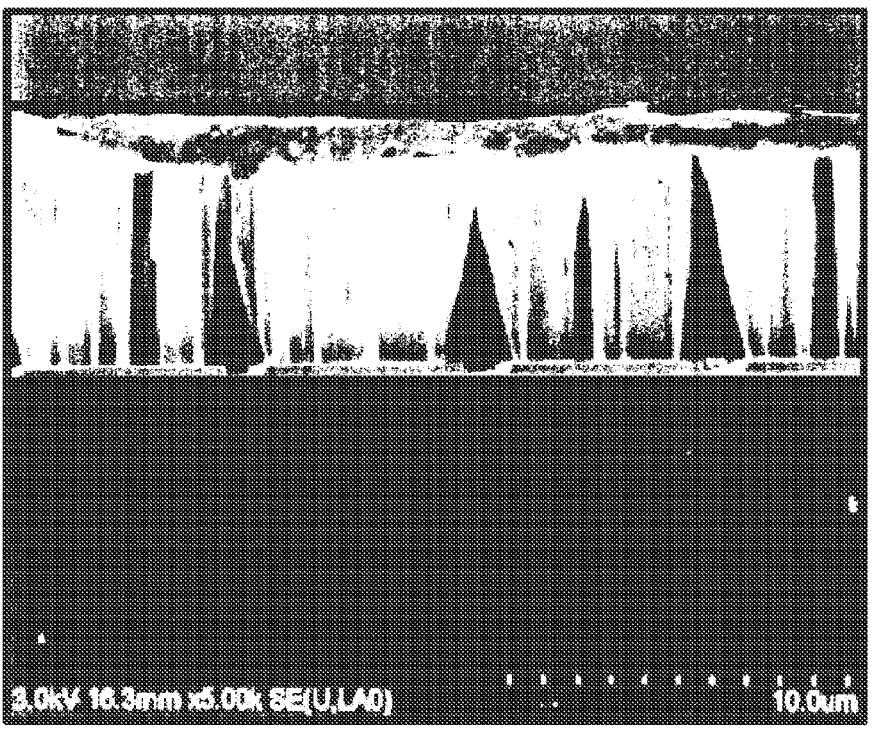
Figure 18:
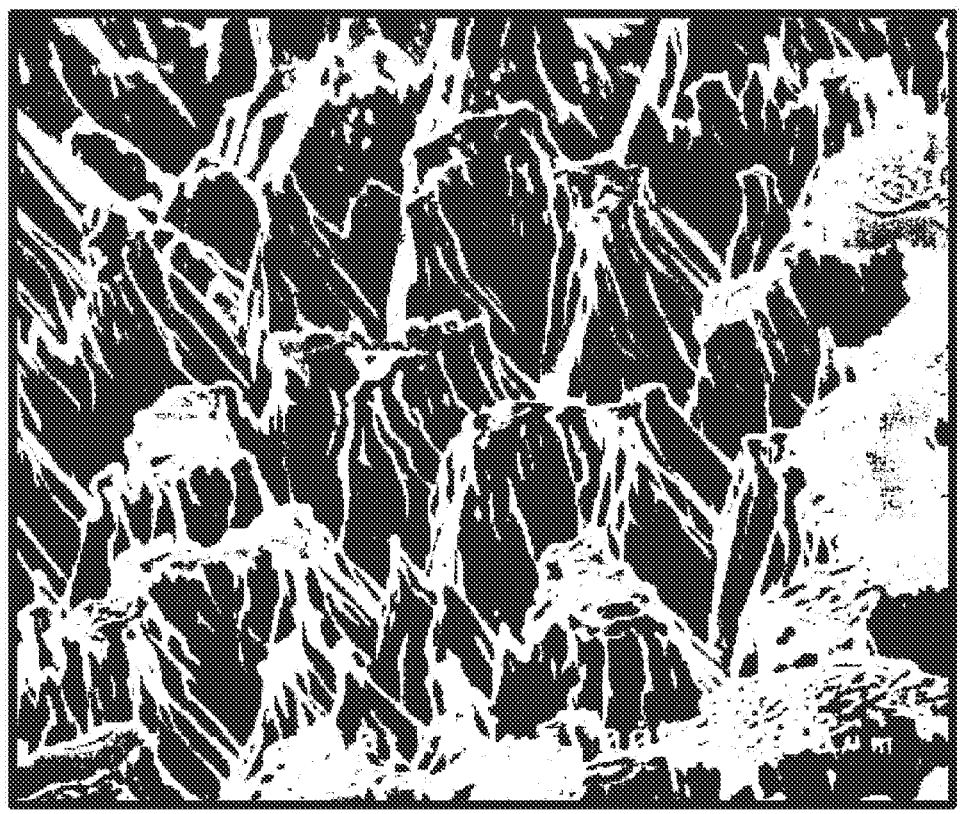
FIG. 18 is an SEM photograph (overhead view) illustrating a state in which a substrate is lifted off from a chip having the template in the third example in a manufacturing method of a semiconductor device according to the second embodiment.
Figure 19A:
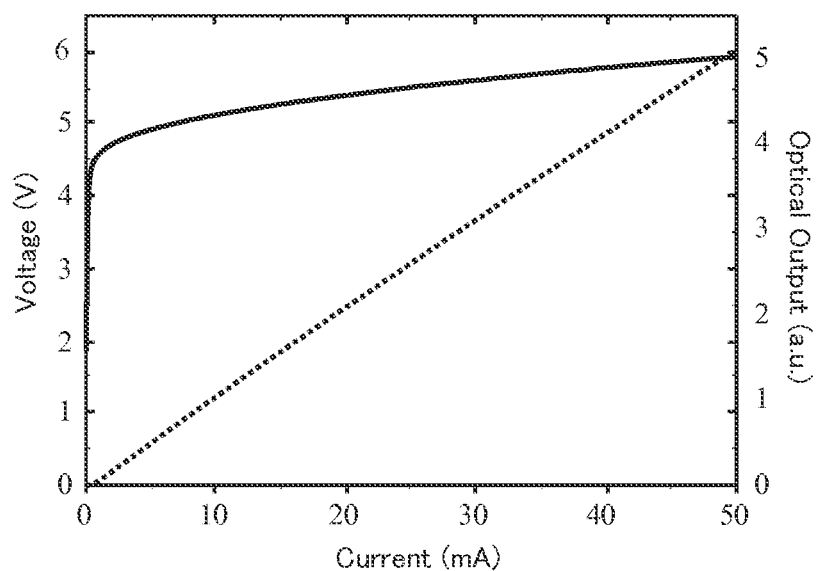
FIG. 19 is a graph illustrating an optical characteristic and electric characteristic when the semiconductor device illustrated in FIG. 18 is driven.
Figure 19B:
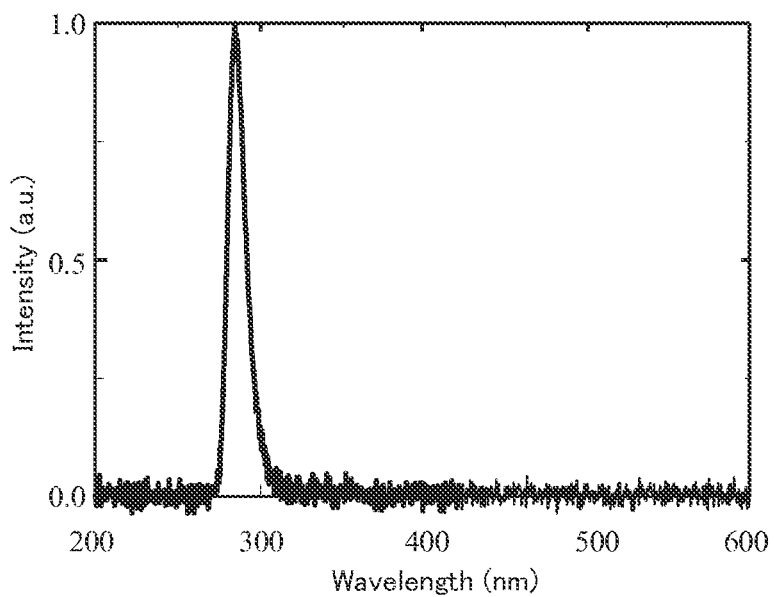

FIGS. 17 to 19 illustrate a result after the cavity expanding process and the lift-off process of the substrate are carried out to the chip having the template 10C (see FIG. 4) in the third example. FIG. 17 is an SEM photograph (side view) illustrating a state of the chip having the template in the third example before and after the cavity expanding process. FIG. 18 is an SEM photograph (overhead view) illustrating the state in which the substrate is lifted off from the chip having the template in the third example. It illustrates the state in which the AlN layer (the ELO layer that is the upper layer in the figure) is exposed by the lift-off. FIG. 19 is a graph illustrating an optical characteristic and electric characteristic when the semiconductor device illustrated in FIG. 18 is driven. FIG. 19A is a graph respectively illustrating an applied voltage and optical output according to the applied current, wherein a solid line indicates the applied voltage, and a broken line indicates the optical output. FIG. 19B is a graph illustrating a wavelength characteristic of an intensity of light emitted when the semiconductor device is driven. In the present embodiment, the chip is immersed in KOH of 80° C. for 15 minutes in the cavity expanding process.

As illustrated in FIG. 17, a part of the template layer is etched, and the cavity is expanded in the cavity expanding process. The cavity is expanded to reach the top surface of the substrate. Therefore, when the substrate is lifted off, the template layer having the moth-eye structure is exposed as illustrated in FIG. 18. As illustrated in FIG. 18, the substrate can be lifted off from the AlN layer without giving fatal damage to the device structure portion by employing the above-mentioned lift-off process. Therefore, the obtained semiconductor device (light-emitting diode) can normally be driven (can normally emit light) as illustrated in FIG. 19.

<Third Embodiment>

A third embodiment of the manufacturing method of a semiconductor device will be described below with reference to the drawings. The processes other than the process (the lift-off process of the substrate) described in the first embodiment are the same in the present embodiment. Therefore, the corresponding process in the first embodiment is referred to, and the detailed description will not be repeated.

(Lift-off Process of Substrate)

The lift-off process according to the present embodiment includes an irradiation process of emitting a laser light with a wavelength, by which the laser light passes through the substrate 11 and is absorbed, by AlN, from the side close to the substrate 11 on the chip 30 as in the first embodiment, and an etching process of etching the AlN layer by using predetermined solvent after the irradiation process.

The irradiation process is the same as the lift-off process in the first embodiment, but is different in that the output of the laser light is small in order to remove a part of the substrate 11. For example, it is preferable that the output (energy density) of the laser light emitted in the irradiation process is 0.01 $J/cm^2$ or more and 1 $J/cm^2$ or less.

The etching process is carried out to remove the interface of the substrate 11 and the AlN layer that is not removed by the irradiation process. Since the substrate 11 is partly removed from the AlN layer by the irradiation process, the solvent enters from the removed portion so as to be capable of effectively etching the interface between the substrate 11 and the AlN layer. When the irradiation process is not carried out, the solvent is difficult to enter the interface between the substrate 11 and the AlN layer. Therefore, it is difficult to lift off the substrate 11 only by the etching.

KOH is preferably used as the solvent for carrying out the etching process. It is preferable that the concentration of KOH is set as 1 mol/l or more and 8 mol/l or less, the immersion temperature is set as room temperature or higher and 150° C. or lower, and the immersion time is set as 30 seconds or longer and one day or shorter, since these conditions can allow the substrate 11 to be easily removed from the AlN layer.

According to the manufacturing method of the semiconductor device in the present embodiment, the substrate 11 can be lifted off from the AlN layer by utilizing a mechanism (increase in compressive stress) that is different from a mechanism (deposition and melting of Ga) for lifting off the substrate from a GaN layer. Since the substrate 11 can be lifted off from the AlN layer formed on the surface of the substrate 11, the formation of a special layer for the lift-off in the template layer 12 or the device structure portion 21 is not needed. Therefore, the substrate 11 can easily be lifted off. By lifting off the substrate 11, the heat radiation, performance of the device structure portion 20 can be enhanced, the efficiency of extracting light generated on the device structure portion 20 can be enhanced, and a vertical structure can be realized.

According to the manufacturing method of a semiconductor device in the present embodiment, the substrate 11 can be removed from the AlN layer in a stepwise manner. This structure can also reduce impact applied to the device structure portion 20 upon lifting off the substrate 11.

A specific example of the semiconductor device obtained by the manufacturing method of the semiconductor device according to the third embodiment will be described with reference to FIGS. 20 to 25.

Figure 20:
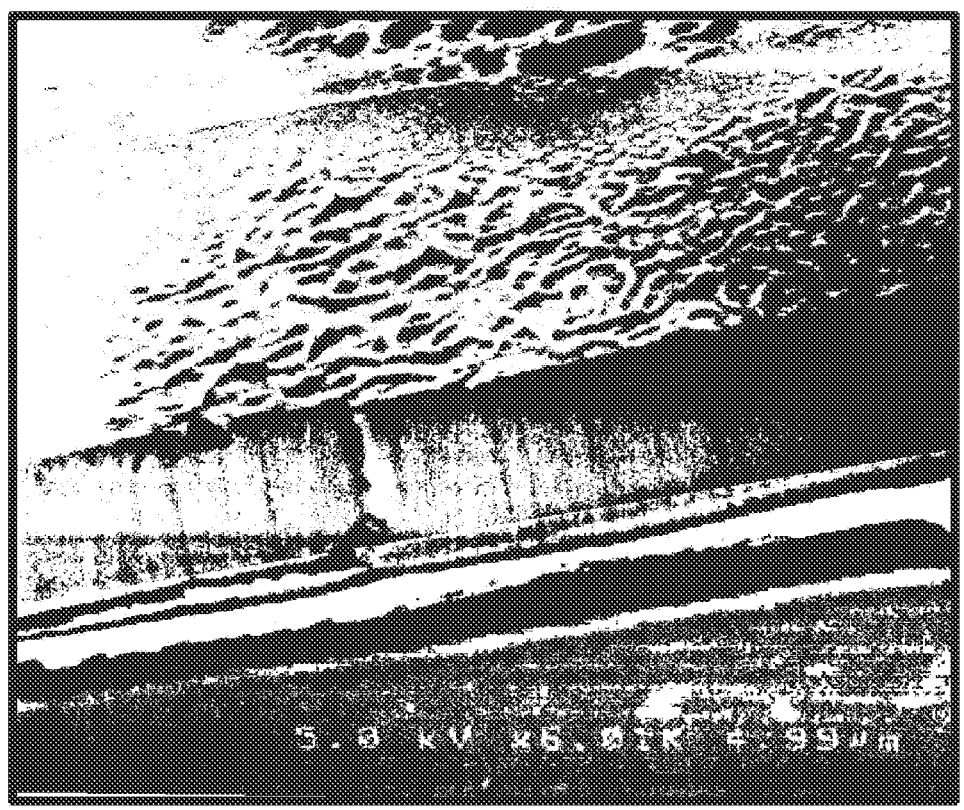
FIG. 20 is an SEM photograph (overhead view) illustrating a state in which a substrate is lifted off from a chip having the template in the first example in a manufacturing method of a semiconductor device according to a third embodiment.
Figure 21A:
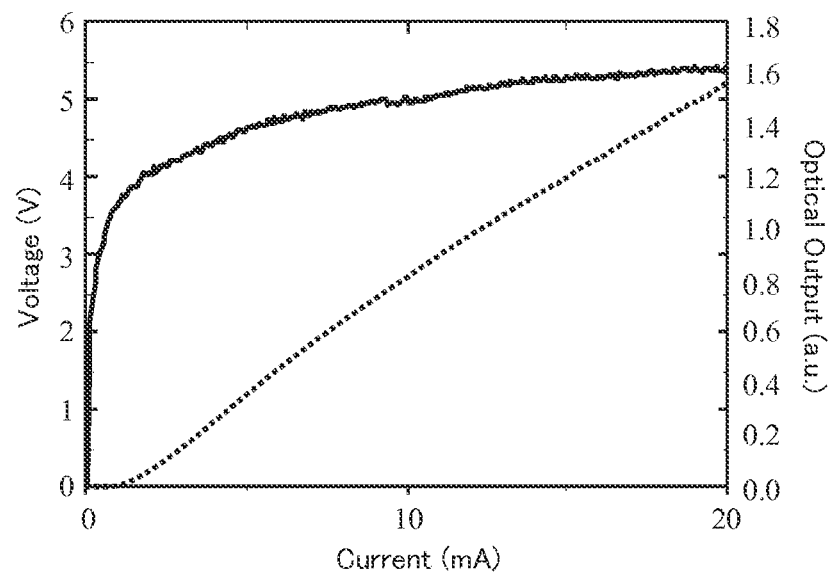
FIG. 21 is a graph illustrating an optical characteristic and electric characteristic when the semiconductor device illustrated in FIG. 20 is driven.
Figure 21B:
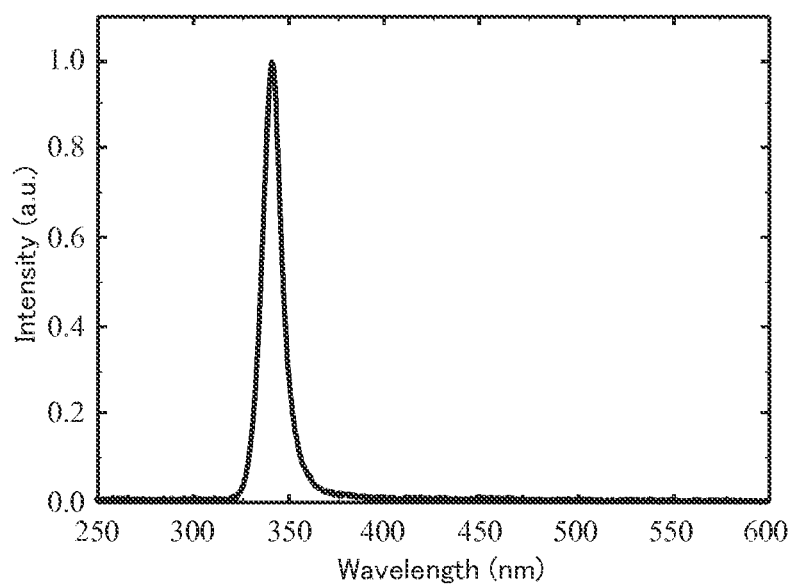

FIGS. 20 and 21 illustrate a result after the lift-off process of the substrate is carried out to the chip having the template 10A (see FIG. 2) in the first example. FIG. 20 is an SEM photograph (overhead view) illustrating the state in which the substrate is lifted off from the chip having the template in the first example. It illustrates the state in which the AlN layer (the planar growth layer that is the upper layer in the figure) is exposed by the lift-off. FIG. 21 is a graph illustrating an optical characteristic and electric characteristic when the semiconductor device illustrated in FIG. 20 is driven. FIG. 21A is a graph respectively illustrating an applied voltage and optical output according to the applied current, wherein a solid line indicates the applied voltage, and a broken line indicates the optical output. FIG. 21B is a graph illustrating a wavelength characteristic of an intensity of light emitted when the semiconductor device is driven.

As illustrated in FIG. 20, the substrate can be lifted off from the AlN layer with the device structure portion being protected by employing the above-mentioned lift-off process, as in the first embodiment (see FIG. 8). Therefore, the obtained semiconductor device (light-emitting diode) can normally be driven (can normally emit light) as illustrated in FIG. 21.

Figure 22:
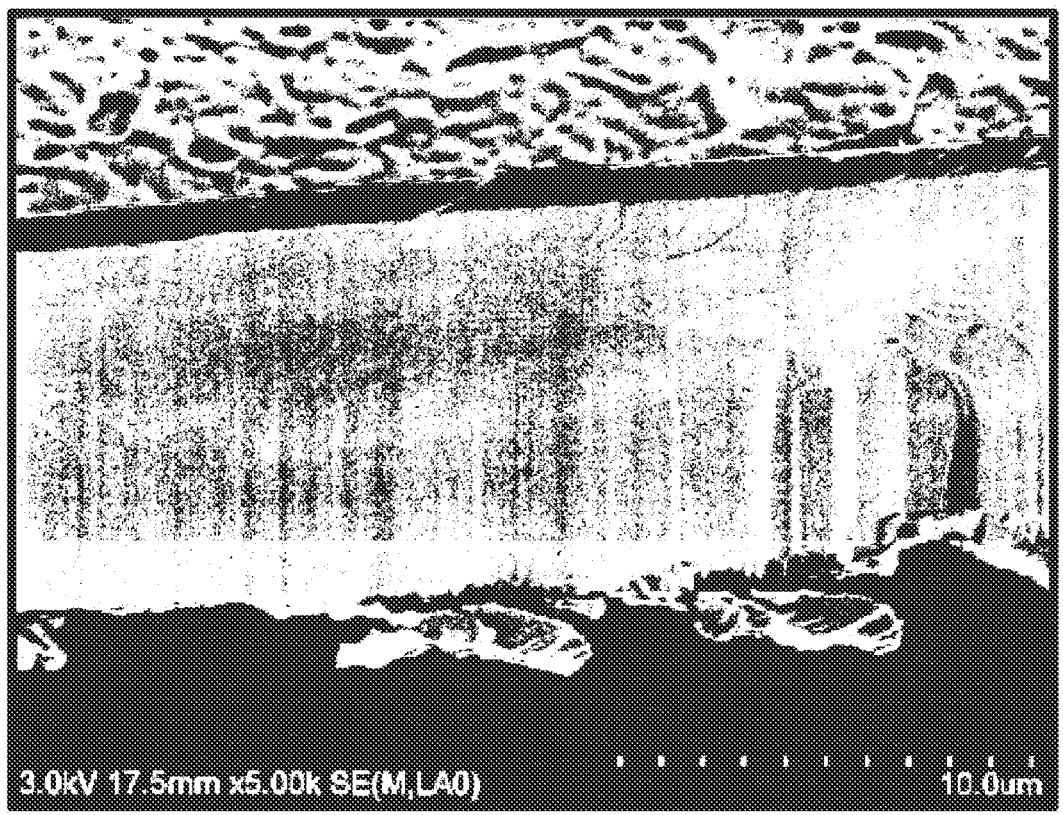
FIG. 22 is an SEM photograph (overhead view) illustrating a state in which a substrate is lifted off from a chip having the template in the second example in a manufacturing method of a semiconductor device according to the third embodiment.
Figure 23A:
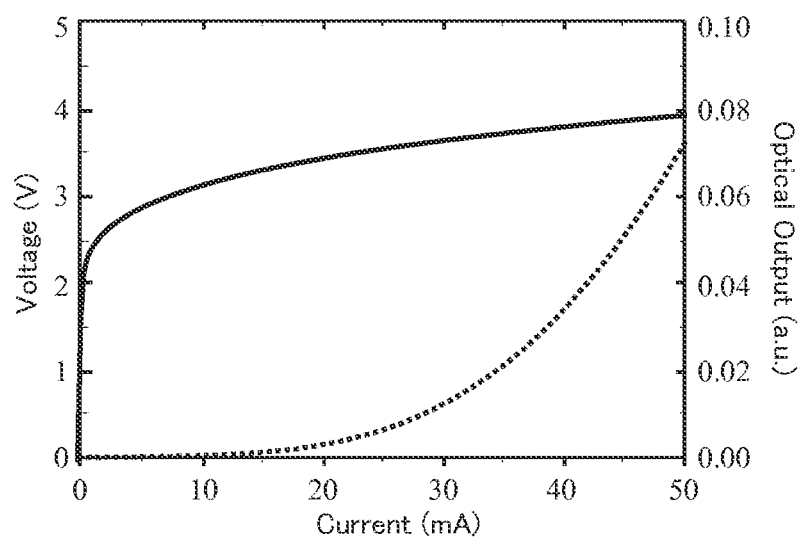
FIG. 23 is a graph illustrating an optical characteristic and electric characteristic when the semiconductor device illustrated in FIG. 22 is driven.
Figure 23B:
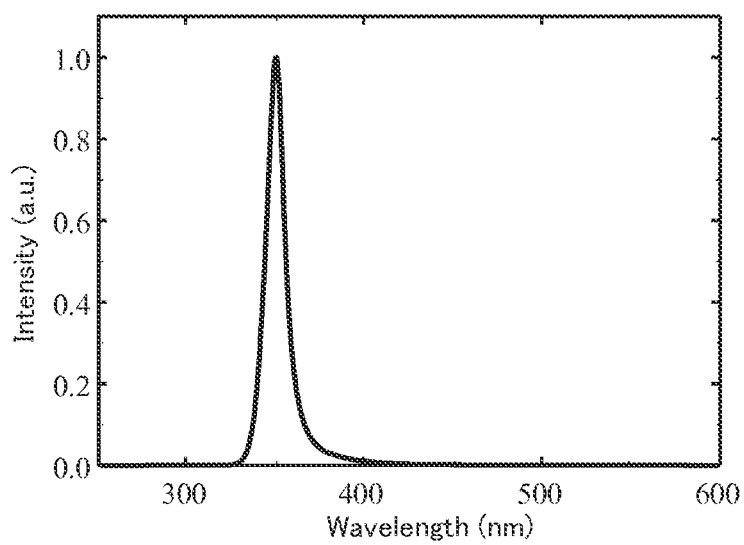

FIGS. 22 and 23 illustrate a result after the lift-off process of the substrate is carried out to the chip having the template 10B (see FIG. 3) in the second example. FIG. 22 is an SEM photograph (overhead view) illustrating the state in which the substrate is lifted off from the chip having the template in the first example. It illustrates the state in which the AlN layer (the initial layer that is the upper layer in the figure) is exposed by the lift-off. FIG. 23 is a graph illustrating an optical characteristic and electric characteristic when the semiconductor device illustrated in FIG. 22 is driven. FIG. 23A is a graph respectively illustrating an applied voltage and optical output according to the applied current, wherein a solid line indicates the applied voltage, and a broken line indicates the optical output. FIG. 23B is a graph illustrating a wavelength characteristic of an intensity of light emitted when the semiconductor device is driven.

As illustrated in FIG. 22, the substrate can be lifted off from the AlN layer with the device structure portion being protected by employing the above-mentioned lift-off process, as in the first embodiment (see FIG. 10). Therefore, the obtained semiconductor device (light-emitting diode) can normally be driven (can normally emit light) as illustrated in FIG. 23.

Figure 24:
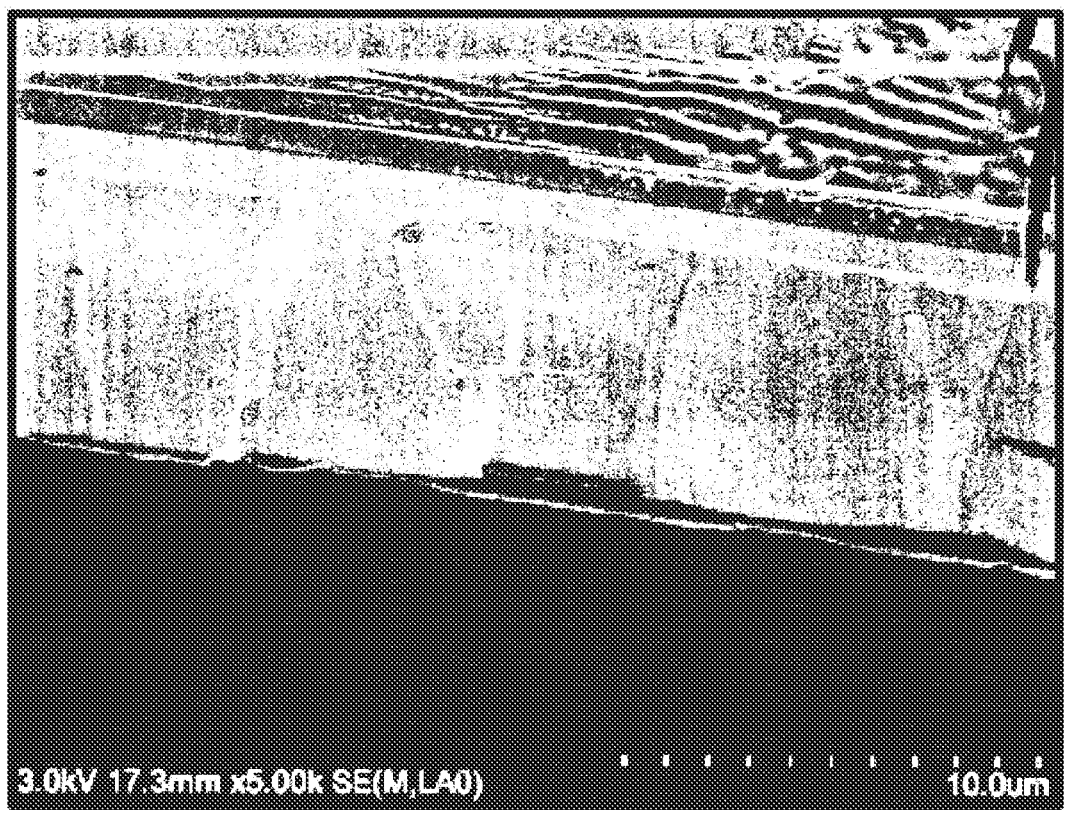
FIG. 24 is an SEM photograph (overhead view) illustrating a state in which a substrate is lifted off from a chip having the template in the third example in a manufacturing method of a semiconductor device according to the third embodiment.
Figure 25A:
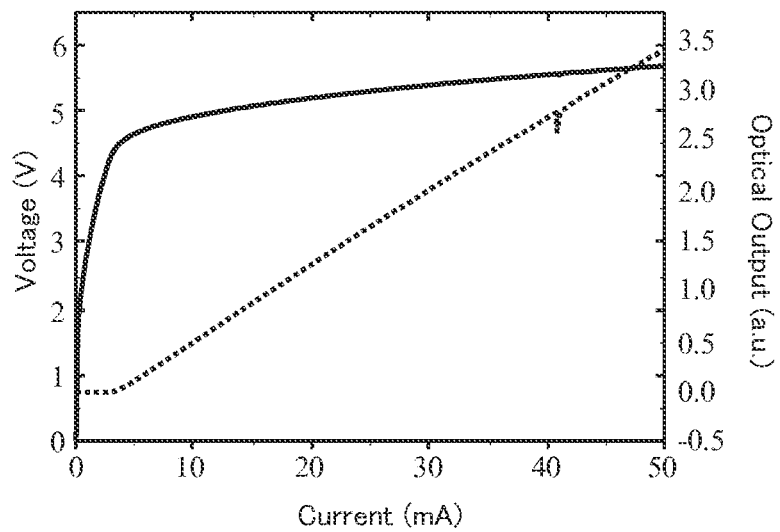
FIG. 25 is a graph illustrating an optical characteristic and electric characteristic when the semiconductor device illustrated in FIG. 24 is driven.
Figure 25B:
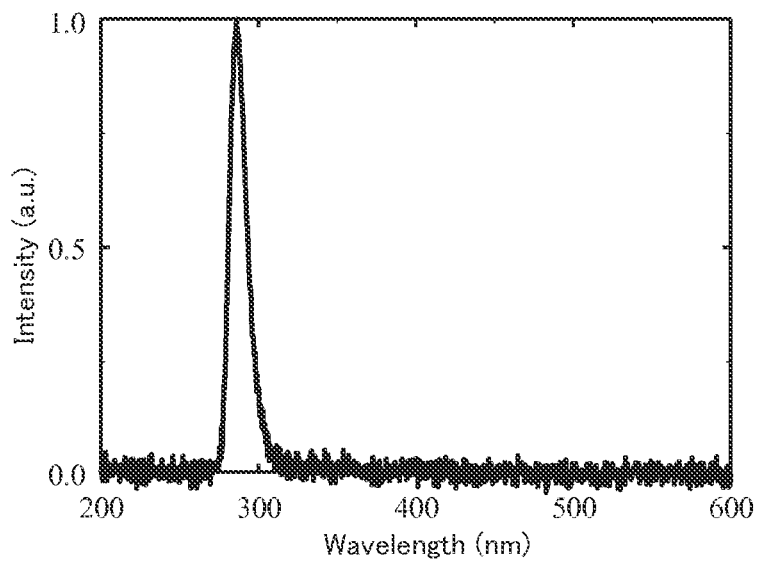

FIGS. 24 and 25 illustrate a result after the lift-off process of the substrate is carried out to the chip having the template 10C (see FIG. 4) in the third example. FIG. 24 is an SEM photograph (overhead view) illustrating the state in which the substrate is lifted off from the chip having the template in the third example. It illustrates the state in which the AlN layer (the ELO layer that is the upper layer in the figure) is exposed by the lift-off. FIG. 25 is a graph illustrating an optical characteristic and electric characteristic when the semiconductor device illustrated in FIG. 24 is driven. FIG. 25A is a graph respectively illustrating an applied voltage and optical output according to the applied current, wherein a solid line indicates the applied voltage, and a broken line indicates the optical output. FIG. 25B is a graph illustrating a wavelength characteristic of an intensity of light emitted when the semiconductor device is driven.

As illustrated in FIG. 24, the substrate can be lifted off from the AlN layer with the device structure portion being protected by employing the above-mentioned lift-off process, as in the first embodiment (see FIG. 12). Therefore, the obtained semiconductor device (light-emitting diode) can normally be driven (can normally emit light) as illustrated in FIG. 25.

<Modification>

Various modifications of the first to the third embodiments of the manufacturing method of a semiconductor device will be described below with reference to the drawings. Firstly, a modification of the fixing process will be described with reference to FIGS. 26 to 28.

Figure 26:
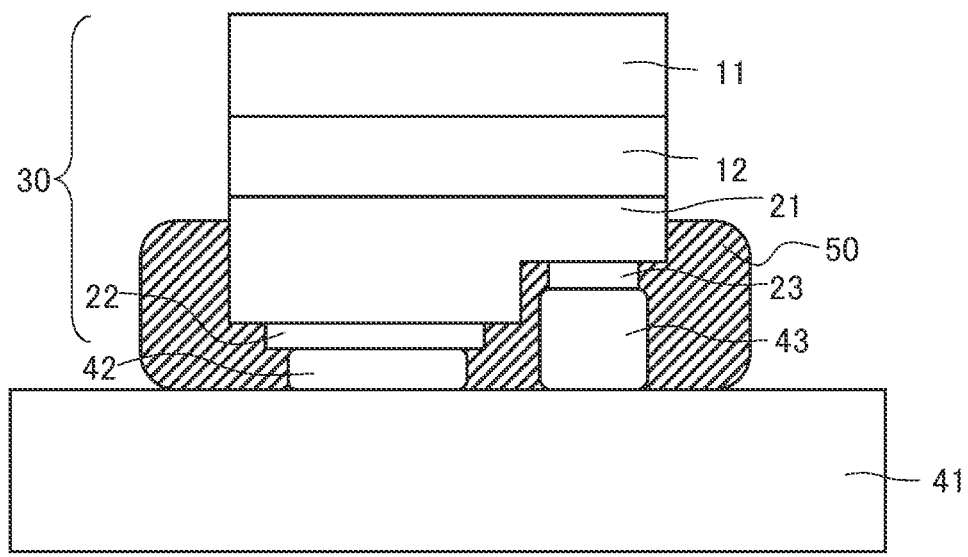
FIG. 26 is a schematic side view illustrating a modification of a fixing process.

FIG. 26 is a schematic side view illustrating the modification of the fixing process. As illustrated in FIG. 26, an underfill 50 may be filled in the gap between the chip 30 and the mounting surface of the mounting substrate 41 in the fixing process of each embodiment. When the underfill 50 having fluidity is used, for example, a part of the underfill 50 is made close to the gap to be only in contact with at least one of the chip 30 and the mounting surface of the mounting substrate 41, whereby the underfill 50 can be filled in the gap by a capillary action. Then, the underfill 50 is hardened by the application of heat. It is preferable that the underfill 50 is a material having resistance to light emitted from the semiconductor device, for example. Specifically, a silicon resin is preferably used for the semiconductor device emitting light with an ultraviolet wavelength.

When the underfill 50 is filled in the gap between the chip 30 and the mounting surface of the mounting substrate 41 as described above, impact applied to the device structure portion 20 upon lifting off the substrate 11 can be reduced.

Figure 27:
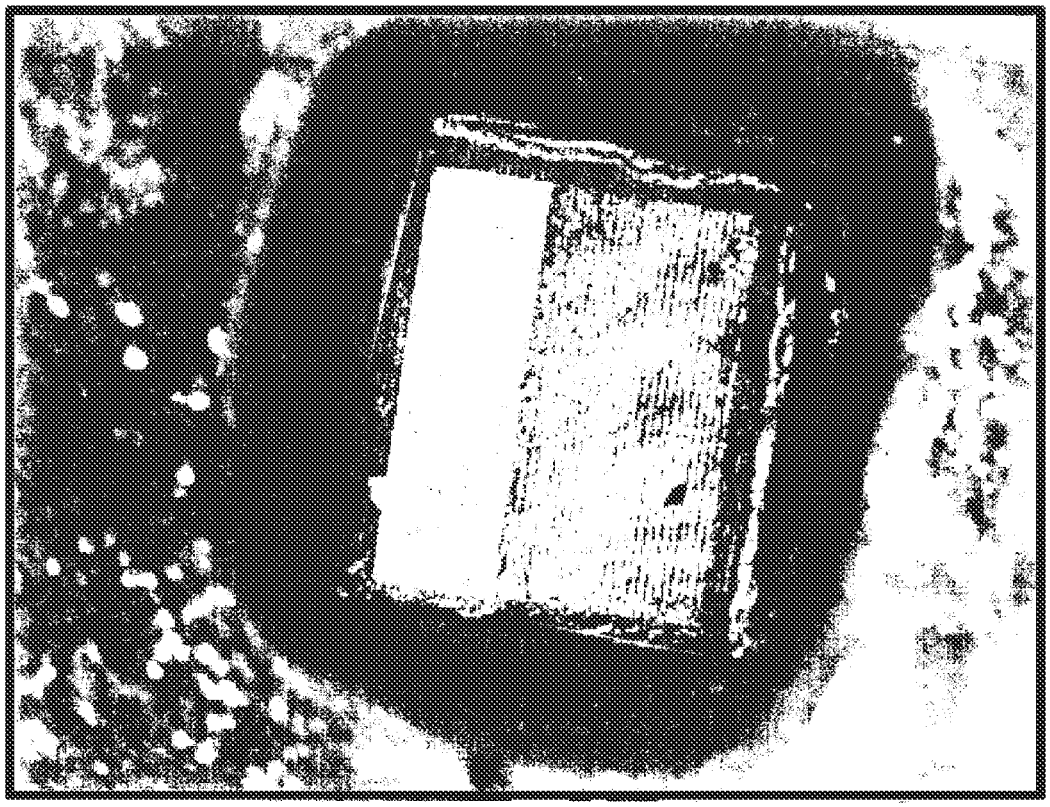
FIG. 27 is an optical micrograph (plan view) illustrating the state in which the substrate is lifted off from the chip after the fixing process illustrated in FIG. 26.
Figure 28A:
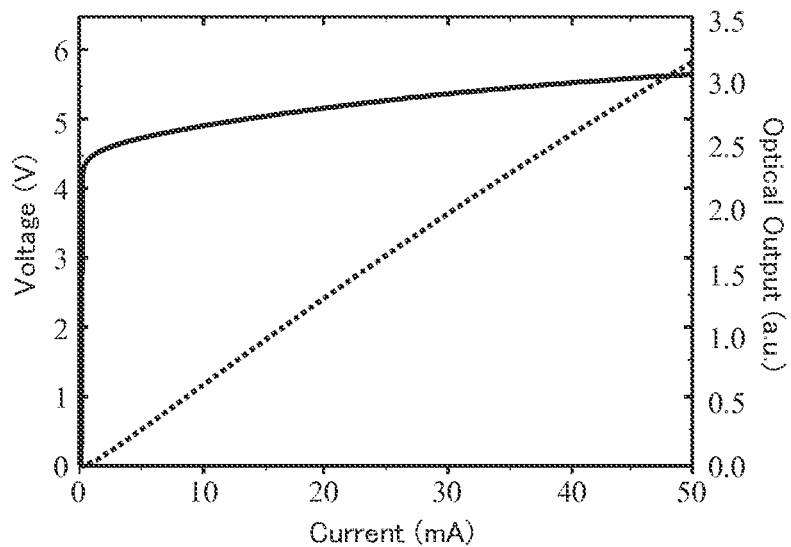
FIG. 28 is a graph illustrating an optical characteristic and electric characteristic when the semiconductor device illustrated in FIG. 27 is driven.
Figure 28B:
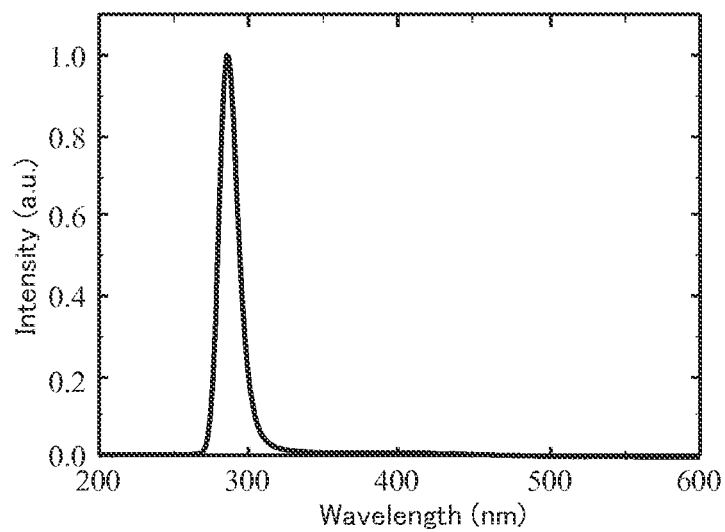

FIG. 27 is an optical micrograph (plan view) illustrating the state in which the substrate is lifted off from the chip after the fixing process illustrated in FIG. 26. FIG. 28 is a graph illustrating an optical characteristic and electric characteristic when the semiconductor device illustrated in FIG. 27 is driven. FIG. 28A is a graph respectively illustrating an applied voltage and optical output according to the applied current, wherein a solid line indicates the applied voltage, and a broken line indicates the optical output. FIG. 28B is a graph illustrating a wavelength characteristic of an intensity of light emitted when the semiconductor device is driven. FIG. 27 illustrates the semiconductor device manufactured by the manufacturing method of a semiconductor device according to the first embodiment, and illustrates the state in which the substrate is lifted off from the chip having the template 10B (see FIG. 3) in the second example.

As illustrated in FIG. 27, the use of the underfill 50 can prevent a break or crack of the device structure portion. Specifically, the substrate can be lifted off from the AlN layer with the device structure portion being protected by employing the above-mentioned lift-off process. Therefore, the obtained semiconductor device (light-emitting diode) can accurately and normally be driven (can normally emit light) as illustrated in FIG. 28.

In the above description, the template layer 12 is formed on the {0001} plane of the sapphire substrate. However, the template layer may be formed on a plane other than the {0001} plane, such as {11-20} plane, {10-10} plane, and {10-12} plane. A substrate made of a material other than sapphire (e.g., spinel) can be used, provided that the substrate to be used is preferably the one that can pass a laser light with a wavelength absorbed by the AlN layer, and that can generate compressive stress on the AlN layer formed on its top surface.

In the above description, the substrate 11 is lifted off after the chip is fixed on the mounting substrate 41. However, the timing of lifting off the substrate 11 is not limited thereto. For example, the substrate 11 may be lifted off before the structure in the form of the wafer is divided into a chip. In this case, the structure is preferably half-cut. Further, in this case, the substrate 11 may gradually be removed from the AlN layer for each device by successively emitting laser light in a unit of an element, or the substrate 11 may be removed from the AlN layer gradually or at a time by increasing a spot of the laser light for irradiating the range including plural element units with the laser light.

INDUSTRIAL APPLICABILITY

The manufacturing method of a semiconductor device according to the present invention is applicable to a manufacture of a semiconductor device such as a light-emitting diode or semiconductor laser.

EXPLANATION OF REFERENCES

1: semiconductor device (light emitting diode)
10, 10A to 10C: template
11: substrate
12: template layer
121: planar growth layer
122: initial layer
123: ELO layer
124: ELO layer
20: device structure portion
21: stacked layer portion
22: p-side electrode
23: n-side electrode
30: chip
41: mounting substrate
42: p-side bump
43: n-side bump
V1, V2: cavity (void)

The invention claimed is:

1. A method for manufacturing a semiconductor device, comprising:
a lift-off process that includes, for a structure including a substrate, a template layer formed on the surface of the substrate and including an AlN layer epitaxially grown on the surface of the substrate, and a device structure portion formed by stacking AlGaN semiconductor layers on the template layer, the template layer including a laterally grown layer that is formed by growing AlN or AlGaN in a lateral direction on the surface of the AlN layer after the surface of the AlN layer is formed to have irregularities;

an irradiating process for irradiating the AlN layer from a side close to the substrate with a laser light with a wavelength by which the laser light passes through the substrate and the laser light is absorbed by the AlN layer, in a state in which the AlN layer receives compressive stress from the substrate, so that the AlN layer expands more than the surface of the substrate on at least an interface between the AlN layer and the substrate so as to increase the compressive stress, in order to remove the substrate from the AlN layer; and a cavity expanding process in which solvent is injected into a cavity generated by the lateral growth during the formation of the template layer in order to expand the cavity, before the lift-off process.

2. The method for manufacturing the semiconductor device according to claim 1, wherein
the substrate is made of sapphire, and the surface of the substrate is {0001} plane, the wavelength of the laser light is 200 nm or less, and
the compressive stress received by the AlN layer from the substrate before the irradiation of the laser light is 10 MPa or more.

3. The method for manufacturing the semiconductor device according to claim 1, comprising
a dividing process in which the structure that is in a form of a wafer is divided into an element unit, before the lift-off process.

4. The method for manufacturing the semiconductor device according to claim 1, comprising
a dividing process in which at least the template layer and the device structure portion of the structure that is in a form of a wafer are divided into an element unit with the wafer state being kept, before the lift-off process.

5. The method for manufacturing the semiconductor device according to claim 1, comprising
a fixing process for fixing the surface of the device structure portion of the structure to a surface of a predetermined support member, before the lift-off process.

6. The method for manufacturing the semiconductor device according to claim 5, wherein
the fixing process includes:
a connection process for connecting the surface of the device structure portion of the structure and the surface of the support member in order that a gap is formed on at least a portion between them; and
a filling process of filling a filler into the gap.

7. The method for manufacturing the semiconductor device according to claim 1, wherein
the surface that is exposed by the removal of the substrate in the lift-off process is a rough surface.

8. The method for manufacturing the semiconductor device according to claim 1, wherein:
a growth temperature of the AlN layer epitaxially grown on the surface of the substrate is 1000° C. or more.

9. A method for manufacturing a semiconductor device, comprising
a lift-off process that includes, for a structure including a substrate, a template layer formed on the surface of the substrate and including an AlN layer, and a device structure portion formed by stacking AlGaN semiconductor layers on the template layer, irradiating the AlN layer from a side close to the substrate with a laser light with a wavelength by which the laser light passes through the substrate and the laser light is absorbed by the AlN layer, in a state in which the AlN layer receives compressive stress from the substrate, so that the AlN layer expands more than the surface of the substrate on at least an interface between the AlN layer and the substrate so as to increase the compressive stress, in order to remove the substrate from the AlN layer; wherein the AlN layer is formed by growing AlN in a lateral direction on the surface of the substrate that is formed to have irregularities; and a cavity expanding process in which solvent is injected into a cavity generated by the lateral growth during the formation of the template layer in order to expand the cavity, before the lift-off process.

10. A method for manufacturing a semiconductor device, comprising:
an irradiation process that includes, for a structure including a substrate, a template layer formed on a surface of the substrate and including an AlN layer epitaxially grown on the surface of the substrate, and a device structure portion formed by stacking AlGaN semiconductor layers on the template layer;

irradiating the AlN layer from a side close to the substrate with a laser light with a wavelength by which the laser light passes through the substrate and the laser light is absorbed by the AlN layer, in a state in which the AlN layer receives compressive stress from the substrate, so that the AlN layer expands more than the surface of the substrate on at least an interface between the AlN layer and the substrate so as to increase the compressive stress, in order to remove at least a part of the substrate from the AlN layer; and an etching process for removing the substrate from the AlN layer by etching an interface of the AlN layer that is bonded to a part of the substrate not removed from the AlN layer, after the irradiation process.

11. The method for manufacturing the semiconductor device according to claim 10, wherein:
the substrate is made of sapphire, and the surface of the substrate is {0001} plane;
the wavelength of the laser light is 200 nm or less; and
the compressive stress received by the AlN layer from the substrate before the irradiation of the laser light is 10 MPa or more.

12. The method for manufacturing the semiconductor device according to claim 10, wherein:
the AlN layer is formed by growing AlN in a lateral direction on the surface of the substrate that is formed to have irregularities, the method comprising:
a cavity expanding process in which solvent is injected into a cavity generated by the lateral growth during the formation of the template layer in order to expand the cavity, before the irradiation process.

13. The method for manufacturing the semiconductor device according to claim 10, wherein:
the template layer includes a laterally grown layer that is formed by growing AlN or AlGaN in a lateral direction on the surface of the AlN layer after the surface of the AlN layer is formed to have irregularities, the method comprising:
a cavity expanding process in which solvent is injected into a cavity generated by the lateral growth during the formation of the template layer in order to expand the cavity, before the irradiation process.

14. The method for manufacturing the semiconductor device according to claim 10, wherein:
   a growth temperature of the AlN layer epitaxially grown on the surface of the substrate is 1000° C. or more.

* * * * *